US010290260B2

(12) United States Patent
Wu et al.

(10) Patent No.: US 10,290,260 B2
(45) Date of Patent: May 14, 2019

(54) PIXEL CIRCUIT HAVING THIRD DRIVE CIRCUIT CONNECTED TO FIRST DRIVE CIRCUIT AND SECOND DRIVE CIRCUIT RESPECTIVELY, DISPLAY PANEL AND DRIVING METHOD

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Yuan Wu, Beijing (CN); Jun Nie, Beijing (CN); Zheng Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/556,549

(22) PCT Filed: Feb. 17, 2017

(86) PCT No.: PCT/CN2017/073897
§ 371 (c)(1),
(2) Date: Sep. 7, 2017

(87) PCT Pub. No.: WO2018/018879
PCT Pub. Date: Feb. 1, 2018

(65) Prior Publication Data
US 2018/0261160 A1 Sep. 13, 2018

(30) Foreign Application Priority Data
Jul. 26, 2016 (CN) .......................... 2016 1 0596931

(51) Int. Cl.
*G06F 3/038* (2013.01)
*G09G 3/3258* (2016.01)
(Continued)

(52) U.S. Cl.
CPC ......... *G09G 3/3258* (2013.01); *G09G 3/3233* (2013.01); *G09G 3/3291* (2013.01);
(Continued)

(58) Field of Classification Search
CPC ................ G09G 3/3258; G09G 3/3291; H01L 27/3262; H01L 27/3265
(Continued)

(56) References Cited

U.S. PATENT DOCUMENTS

2006/0007077 A1* 1/2006 Joo ...................... G09G 3/3208 345/77
2014/0168290 A1* 6/2014 Yang ................... G09G 3/3233 345/691
(Continued)

FOREIGN PATENT DOCUMENTS

CN 103474024 A 12/2013
CN 104751804 A 7/2015
(Continued)

OTHER PUBLICATIONS

International Search Report and Written Opinion dated May 2, 2017; PCT/CN2017/073897.

*Primary Examiner* — Jonathan M Blancha
(74) *Attorney, Agent, or Firm* — Ladas & Parry LLP; Loren K. Thompson

(57) ABSTRACT

A pixel circuit, a display panel and a driving method. The pixel circuit includes a first light-emitting circuit, a first drive circuit, a first compensating circuit, a first data write circuit, a first reset circuit, a first storage circuit, a first initializing circuit, a first light-emitting control circuit, a
(Continued)

second light-emitting circuit, a second drive circuit, a second compensating circuit, a second data write circuit, a second reset circuit, a second storage circuit, a second initializing circuit, a second light-emitting control circuit, a third light-emitting circuit, a third light-emitting control circuit, a third drive circuit, and a third initializing circuit.

18 Claims, 14 Drawing Sheets

(51) Int. Cl.

| | |
|---|---|
| ***G09G 3/3291*** | (2016.01) |
| ***H01L 27/32*** | (2006.01) |
| ***H01L 51/52*** | (2006.01) |
| ***G09G 3/3233*** | (2016.01) |

(52) U.S. Cl.
CPC ...... *H01L 27/3262* (2013.01); *H01L 27/3265* (2013.01); *H01L 51/5206* (2013.01); *G09G 2300/0426* (2013.01); *G09G 2300/0465* (2013.01); *G09G 2300/0814* (2013.01); *G09G 2300/0819* (2013.01); *H01L 27/3213* (2013.01)

(58) Field of Classification Search
USPC .......................................................... 345/205
See application file for complete search history.

(56) References Cited

U.S. PATENT DOCUMENTS

2014/0253421 A1* 9/2014 Izumi ........................ G09G 3/36 345/87
2015/0364083 A1* 12/2015 Jeon ..................... G09G 3/3233 345/76
2016/0210906 A1 7/2016 In et al.

FOREIGN PATENT DOCUMENTS

CN 105074808 A 11/2015
CN 105096837 A 11/2015
CN 106023898 A 10/2016

* cited by examiner

PIXEL CIRCUIT HAVING THIRD DRIVE CIRCUIT CONNECTED TO FIRST DRIVE CIRCUIT AND SECOND DRIVE CIRCUIT RESPECTIVELY, DISPLAY PANEL AND DRIVING METHOD

TECHNICAL FIELD

Embodiments of the present disclosure relate to a pixel circuit, a display panel and a driving method.

BACKGROUND

Organic light-emitting diode (OLED) display panels have wide development prospective in the display field due to the characteristics of autoluminescence, high contrast, low thickness, wide viewing angle, rapid response speed, capability of being applied to flexible panels, wide service temperature range, simple production, etc.

Due to the above characteristics, an OLED display panel may be applied to a device with display function such as a mobile phone, a display, a notebook computer, a digital camera, an instrument or the like.

SUMMARY

An embodiment of the present disclosure provides a pixel circuit, comprising: a first light-emitting circuit configured to emit light in a working process; a first drive circuit configured to drive the first light-emitting circuit; a first compensating circuit configured to compensate the first drive circuit; a first data write circuit configured to write data into the first drive circuit; a first reset circuit configured to reset the first drive circuit; a first storage circuit configured to store a driving voltage of the first drive circuit; a first initializing circuit configured to initialize the first light-emitting circuit; a first light-emitting control circuit configured to control ON and OFF operations of the first light-emitting circuit; a second light-emitting circuit configured to emit light in the working process; a second drive circuit configured to drive the second light-emitting circuit; a second compensating circuit configured to compensate the second drive circuit; a second data write circuit configured to write data into the second drive circuit; a second reset circuit configured to reset the second drive circuit; a second storage circuit configured to store a driving voltage of the second drive circuit; a second initializing circuit configured to initialize the second light-emitting circuit; a second light-emitting control circuit configured to control ON and OFF operations of the second light-emitting circuit; a third light-emitting circuit configured to emit light in the working process; a third light-emitting control circuit configured to control ON and OFF operations of the third light-emitting circuit; a third drive circuit configured to drive the third light-emitting circuit; a third initializing circuit configured to initialize the third light-emitting circuit; a first power end configured to provide a first luminous voltage for the first light-emitting circuit, the second light-emitting circuit and the third light-emitting circuit; a second power end configured to provide a second luminous voltage for the first light-emitting circuit, the second light-emitting circuit and the third light-emitting circuit; a third power end configured to provide a reset voltage for the first reset circuit and the second reset circuit; a first data signal end configured to provide a first data signal or a standby signal for the first data write circuit; a second data signal end configured to provide a second data signal or a standby signal for the second data write circuit; a first control end configured to provide a first control signal for controlling ON and OFF operations of the first reset circuit and the second reset circuit; a second control end configured to provide a second control signal for controlling ON and OFF operations of the first data write circuit, the first compensating circuit, the second data write circuit, and the second compensating circuit; a third control end configured to provide a third control signal for controlling ON and OFF operations of the first initializing circuit, the second initializing circuit and the third initializing circuit; and a fourth control end configured to provide a fourth control signal for controlling ON and OFF operations of the first light-emitting circuit, the second light-emitting control circuit and the third light-emitting control circuit.

For example, in the pixel circuit of an embodiment of the present disclosure, the first data write circuit includes a first transistor; the first light-emitting control circuit includes a second transistor and a fifth transistor; the first compensating circuit includes a third transistor; the first drive circuit includes a fourth transistor; the first reset circuit includes a sixth transistor; the first initializing circuit includes a seventh transistor; the first storage circuit includes a first storage capacitor; the first light-emitting circuit includes a first organic light-emitting diode; the third light-emitting control circuit includes an eighth transistor and a eleventh transistor; the third drive circuit includes a ninth transistor and a tenth transistor; the third initializing circuit includes a twelfth transistor; the second reset circuit includes a thirteenth transistor; the second light-emitting control circuit includes a fourteenth transistor and an eighteenth transistor; the second data write circuit includes a fifteenth transistor; the second compensating circuit includes a sixteenth transistor; the second drive circuit includes a seventeenth transistor; the second initializing circuit includes a nineteenth transistor; the second storage circuit includes a second storage capacitor; the second light-emitting circuit includes a second organic light-emitting diode; and the third light-emitting circuit includes a third organic light-emitting diode.

For example, in the pixel circuit of an embodiment of the present disclosure, a source electrode of the first transistor is electrically connected with the first data signal end; a gate electrode of the first transistor and a gate electrode of the third transistor are electrically connected with the second control end; a drain electrode of the first transistor, a drain electrode of the second transistor, a source electrode of the third transistor, and a source electrode of the fourth transistor are electrically connected with each other; a gate electrode of the second transistor and a gate electrode of the fifth transistor are electrically connected with the fourth control end; a source electrode of the second transistor, and a first end of the first storage capacitor are electrically connected with the first power end; a drain electrode of the third transistor is electrically connected with a first node; a gate electrode of the fourth transistor is electrically connected with the first node, and a drain electrode of the fourth transistor is electrically connected with a source electrode of the fifth transistor; a drain electrode of the fifth transistor and a drain electrode of the seventh transistor are electrically connected with a first end of the first organic light-emitting diode; a source electrode of the sixth transistor and a source electrode of the seventh transistor are electrically connected with the third power end; a gate electrode of the sixth transistor is electrically connected with the first control end; a drain electrode of the sixth transistor is electrically connected with the first node; a gate electrode of the seventh transistor is electrically connected with the third control end; a second end of the first storage capacitor is electrically connected with the first node; a second end of the first organic light-emitting diode is electrically connected with the second power end; a source electrode of the eighth transistor is electrically connected with the first power end; a gate electrode of the eighth transistor is electrically connected with the fourth control end; a drain electrode of the eighth transistor is electrically connected with a source electrode of the ninth transistor; a gate electrode of the ninth transistor is electrically connected with the first node, and a drain electrode of the ninth transistor is electrically connected with a source electrode of the tenth transistor; a gate electrode of the tenth transistor is electrically connected with a second node, and a drain electrode of the tenth transistor is electrically connected with a source electrode of the eleventh transistor; a gate electrode of the eleventh transistor is electrically connected with the fourth control end; a drain electrode of the eleventh transistor and a first end of the third organic light-emitting diode, and a drain electrode of the twelfth transistor are electrically connected with each other; a gate electrode of the twelfth transistor is electrically connected with the third control end; a source electrode of the twelfth transistor, a drain electrode of the thirteenth transistor and a source electrode of the nineteenth transistor are electrically connected with the third power end; a source electrode of the thirteenth transistor is electrically connected with the second node, and a gate electrode of the thirteenth transistor is electrically connected with the first control end; a source electrode of the fourteenth transistor and a first end of the second storage capacitor are electrically connected with the first power end; a gate electrode of the fourteenth transistor and a gate electrode of the eighteenth transistor are electrically connected with the fourth control end; a drain electrode of the fourteenth transistor, a drain electrode of the fifteenth transistor, a source electrode of the sixteenth transistor, and a source electrode of the seventeenth transistor are electrically connected with each other; a source electrode of the fifteenth transistor is electrically connected with the second data signal end; a gate electrode of the fifteenth transistor and a gate electrode of the sixteenth transistor are electrically connected with the second control end; a drain electrode of the sixteenth transistor is electrically connected with the second node; a gate electrode of the seventeenth transistor is electrically connected with the second node, and a drain electrode of the seventeenth transistor is electrically connected with a source electrode of the eighteenth transistor; a drain electrode of the eighteenth transistor and a drain electrode of the nineteenth transistor are electrically connected with a first end of the second organic light-emitting diode; a gate electrode of the nineteenth transistor is electrically connected with the third control end; a second end of the second storage capacitor is electrically connected with the second node; a second end of the second organic light-emitting diode is electrically connected with the second power end; and a second end of the third organic light-emitting diode is electrically connected with the second power end.

For example, in the pixel circuit of an embodiment of the present disclosure, the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor, the eighteenth transistor, and the nineteenth transistor are all thin-film transistors (TFTs).

For example, in the pixel circuit of an embodiment of the present disclosure, the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor, the eighteenth transistor and the nineteenth transistor are all P-type transistors.

For example, in the pixel circuit of an embodiment of the present disclosure, a threshold voltage of the fourth transistor is equal to a threshold voltage of the ninth transistor; and a threshold voltage of the tenth transistor is equal to a threshold voltage of the seventeenth transistor.

For example, in the pixel circuit of an embodiment of the present disclosure, the first organic light-emitting diode emits light of first color in the working process; the second organic light-emitting diode emits light of second color in the working process; the third organic light-emitting diode emits light of third color in the working process; and a mixed color of the light of the first color and the light of the second color is the third color.

For example, in the pixel circuit of an embodiment of the present disclosure, the light of the first color is red light; the light of the second color is green light; and the light of the third color is yellow light.

Another embodiment of the present disclosure provides a pixel circuit, comprising: a fourth light-emitting circuit configured to emit light in a working process; a fourth drive circuit configured to drive the fourth light-emitting circuit; a third compensating circuit configured to compensate the fourth drive circuit; a third data write circuit configured to write data into the fourth drive circuit; a third reset circuit configured to reset the fourth drive circuit; a third storage circuit configured to store a driving voltage of the fourth drive circuit; a fourth initializing circuit configured to initialize the fourth light-emitting circuit; a fourth light-emitting control circuit configured to control ON and OFF operations of the fourth light-emitting circuit; a first power end configured to provide a first luminous voltage for the fourth light-emitting circuit; a second power end configured to provide a second luminous voltage for the fourth light-emitting circuit; a third power end configured to provide a reset voltage for the third reset circuit; a third data signal end configured to provide a third data signal or a standby signal for the third data write circuit; a first control end configured to provide a first control signal for controlling ON and OFF operations of the third reset circuit; a second control end configured to provide a second control signal for controlling ON and OFF operations of the third data write circuit and the third compensating circuit; a third control end configured to provide a third control signal for controlling ON and OFF operations of the fourth initializing circuit; and a fourth control end configured to provide a fourth control signal for controlling ON and OFF operations of the fourth light-emitting control circuit.

For example, in the pixel circuit of an embodiment of the present disclosure, the third data write circuit includes a twentieth transistor; the fourth light-emitting control circuit includes a twenty-first transistor and a twenty-fourth transistor; the third compensating circuit includes a twenty-second transistor; the fourth drive circuit includes a twenty-third transistor; the third reset circuit includes a twenty-fifth transistor; the fourth initializing circuit includes a twenty-sixth transistor; the third storage circuit includes a third storage capacitor; and the fourth light-emitting circuit includes a fourth organic light-emitting diode.

For example, in the pixel circuit of an embodiment of the present disclosure, a source electrode of the twentieth transistor is electrically connected with the third data signal end; a gate electrode of the twentieth transistor and a gate electrode of the twenty-second transistor are electrically connected with the second control end; a drain electrode of the twentieth transistor, a drain electrode of the twenty-first transistor, a source electrode of the twenty-second transistor, and a source electrode of the twenty-third transistor are electrically connected with each other; a gate electrode of the twenty-first transistor and a gate electrode of the twenty-fourth transistor are electrically connected with the fourth control end; a source electrode of the twenty-first transistor and a first end of the third storage capacitor are electrically connected with the first power end; a drain electrode of the twenty-second transistor is electrically connected with a third node; a gate electrode of the twenty-third transistor is electrically connected with the third node, and a drain electrode of the twenty-third transistor is electrically connected with a source electrode of the twenty-fourth transistor; a drain electrode of the twenty-fourth transistor and a drain electrode of the twenty-sixth transistor are electrically connected with a first end of the fourth organic light-emitting diode; a source electrode of the twenty-fifth transistor and a source electrode of the twenty-sixth transistor are electrically connected with the third power end; a gate electrode of the twenty-fifth transistor is electrically connected with the first control end; a drain electrode of the twenty-fifth transistor is electrically connected with the third node; a gate electrode of the twenty-sixth transistor is electrically connected with the third control end; a second end of the third storage capacitor is electrically connected with the third node; and a second end of the fourth organic light-emitting diode is electrically connected with the second power end.

For example, in the pixel circuit of an embodiment of the present disclosure, the twentieth transistor, the twenty-first transistor, the twenty-second transistor, the twenty-third transistor, the twenty-fourth transistor, the twenty-fifth transistor and the twenty-sixth transistor are all TFTs.

For example, in the pixel circuit of an embodiment of the present disclosure, the twentieth transistor, the twenty-first transistor, the twenty-second transistor, the twenty-third transistor, the twenty-fourth transistor, the twenty-fifth transistor and the twenty-sixth transistor are all P-type transistors.

Still another embodiment of the present disclosure provides a display panel, comprising the pixel circuit according to any embodiment of the present disclosure.

For example, the display panel of an embodiment of the present disclosure comprises the pixel circuit having the first organic light-emitting diode, the second organic light-emitting diode, and the organic light-emitting diode and the pixel circuit having the fourth organic light-emitting diode.

For example, in the display panel of an embodiment of the present disclosure, the first organic light-emitting diode emits red light in the working process; the second organic light-emitting diode emits green light in the working process; the third organic light-emitting diode emits yellow light in the working process; and the fourth organic light-emitting diode emits blue light in the working process.

Further still another embodiment of the present disclosure provides a driving method of the pixel circuit, comprising: a rest period, a compensation period, an initialization period, and an emission period, wherein in the reset period, the first control end outputs a valid signal; the second control end outputs an invalid signal; the third control end outputs an invalid signal; the fourth control end outputs an invalid signal; the first data signal end outputs a standby signal; the second data signal end outputs a standby signal; in the compensation period, the first control end outputs an invalid signal; the second control end outputs a valid signal; the third control end outputs an invalid signal; the fourth control end outputs an invalid signal; the first data signal end outputs a first data signal, and the second data signal end outputs a standby signal; or the first data signal end outputs a standby signal, and the second data signal end outputs a second data signal; or the first data signal end outputs the first data signal, and the second data signal end outputs the second data signal; in the initialization period, the first control end outputs an invalid signal; the second control end outputs an invalid signal; the third control end outputs a valid signal; the fourth control end outputs an invalid signal; the first data signal end outputs a standby signal; the second data signal end outputs a standby signal; in the emission period, the first control end outputs an invalid signal; the second control end outputs an invalid signal; the third control end outputs an invalid signal; the fourth control end outputs a valid signal; the first data signal end outputs a standby signal; and the second data signal end outputs a standby signal.

For example, the driving method of an embodiment of the present disclosure further comprises: a pre-reset period and a pre-emission period, wherein the pre-reset period is after the emission period and before the reset period; the pre-emission period is after the initialization period and before the emission period; in the pre-reset period, the first control end outputs an invalid signal; the second control end outputs an invalid signal; the third control end outputs an invalid signal; the fourth control end outputs an invalid signal; the first data signal end outputs a standby signal; the second data signal end outputs a standby signal; in the pre-emission period, the first control end outputs an invalid signal; the second control end outputs an invalid signal; the third control end outputs an invalid signal; the fourth control end outputs an invalid signal; the first data signal end outputs a standby signal; and the second data signal end outputs a standby signal.

For example, in the driving method of an embodiment of the present disclosure, in the compensation period, when the first data signal end outputs the first data signal and the second data signal end outputs the standby signal, the first light-emitting circuit emits light independently, and the first data signal is configured to control a luminous brightness of the first light-emitting circuit; when the first data signal end outputs the standby signal and the second data signal end outputs the second data signal, the second light-emitting circuit emits light independently, and the second data signal is configured to control a luminous brightness of the second light-emitting circuit; when the first data signal end outputs the first data signal and the second data signal end outputs the second data signal, the first light-emitting circuit, the second light-emitting circuit and the third light-emitting circuit emit light simultaneously; the first data signal is configured to control the luminous brightness of the first light-emitting circuit; the second data signal is configured to control the luminous brightness of the second light-emitting circuit; and a smaller data signal in the first data signal and the second data signal is configured to control a luminous brightness of the third light-emitting circuit.

Further still embodiment of the present disclosure provides a driving method of the pixel circuit, comprising: a reset period, a compensation period, an initialization period and an emission period, wherein in the reset period, the first control end outputs a valid signal; the second control end outputs an invalid signal; the third control end outputs an invalid signal; the fourth control end outputs an invalid signal; the third data signal end outputs a standby signal; in the compensation period, the first control end outputs an invalid signal; the second control end outputs a valid signal; the third control end outputs an invalid signal; the fourth control end outputs an invalid signal; the third data signal end outputs a third data signal or a standby signal; in the initialization period, the first control end outputs an invalid signal; the second control end outputs an invalid signal; the third control end outputs a valid signal; the fourth control end outputs an invalid signal; the third data signal end outputs a standby signal; in the emission period, the first control end outputs an invalid signal; the second control end outputs an invalid signal; the third control end outputs an invalid signal; the fourth control end outputs a valid signal; and the third data signal end outputs a standby signal.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
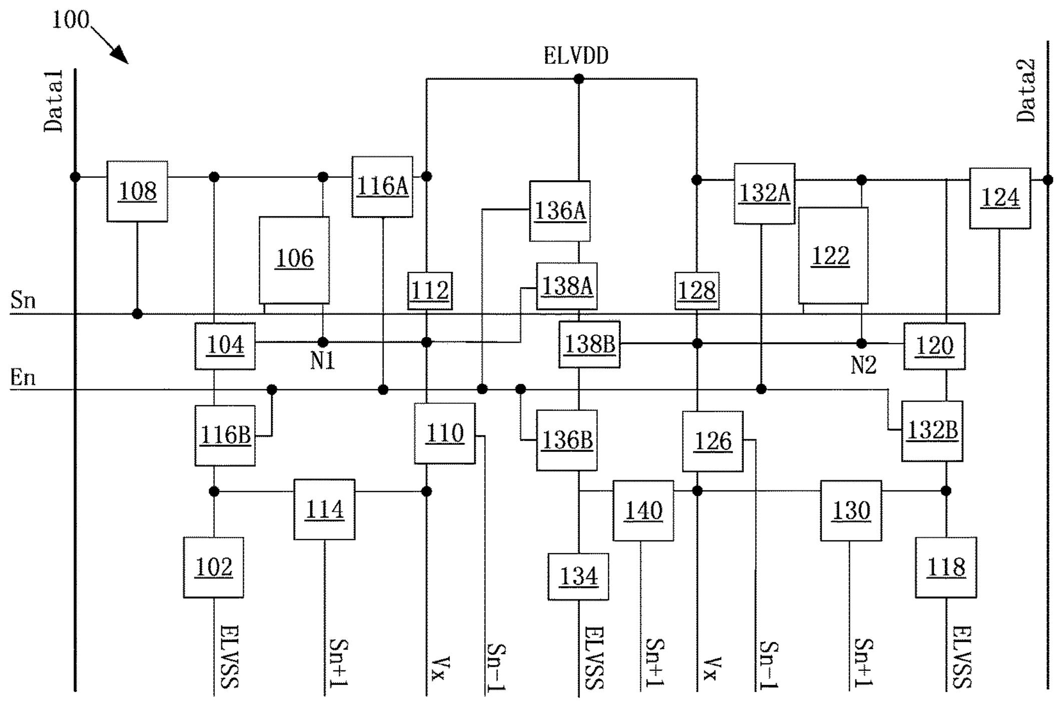
FIG. 1 is a first schematic diagram of a pixel circuit provided by an embodiment of the present disclosure.

Clear and complete description will be given below to the technical proposals of the embodiments of the present disclosure to provide more comprehensive description on the preferred embodiments of the present disclosure and a variety of characteristics and favorable details thereof, with reference to the accompanying drawings and non-limiting preferred embodiments shown in the accompanying drawings and described in detail in the following description. It should be noted that the characteristics shown in the figures are not drawn in scale. The present disclosure omits the description on the known materials, components and process techniques, thereby not obscuring the preferred embodiments of the present disclosure. The given examples are only intended to facilitate an understanding of the implementation of the preferred embodiments of the present disclosure, so that the preferred embodiments can be further implemented by those skilled in the art. Therefore, the examples should not be construed as the limitation of the scope of the embodiments of the present disclosure.

Unless otherwise specified, the technical terms or scientific terms used in the present disclosure shall have normal meanings understood by those skilled in the art. The words "first", "second" and the like used in the present disclosure do not indicate any sequence, number or importance and are only intended to distinguish different components. In addition, in the embodiments of the present disclosure, same or similar reference numerals indicate same or similar members.

An OLED display panel generally comprises a plurality of pixel units; each pixel unit includes a plurality of subpixels respectively comprising OLEDs capable of emitting light of different colors; and each OLED may be respectively driven by a pixel circuit. However, because the pixel circuit occupies a large area, the resolution of the display panel can be affected.

Embodiments of the present disclosure provide a pixel circuit, a display panel and a driving method, which not only can reduce the occupied area of the pixel circuit and improve the resolution of the display panel but also can perform initialization discharge on OLEDs, ensure the accuracy under a low gray scale and full black under the state of a full dark frame, and effectively improve the contrast of the entire display panel.

For instance, FIG. 1 is a first schematic diagram of a pixel circuit provided by an embodiment of the present disclosure. As illustrated in FIG. 1, the embodiment of the present disclosure provides a pixel circuit 100, which comprises: a first light-emitting circuit 102 configured to emit light in a working process; a first drive circuit 104 configured to drive the first light-emitting circuit 102; a first compensating circuit 106 configured to compensate the first drive circuit 104; a first data write circuit 108 configured to write data into the first drive circuit 104; a first reset circuit 110 configured to reset the first drive circuit 104; a first storage circuit 112 configured to store the driving voltage of the first drive circuit 104; a first initializing circuit 114 configured to initialize the first light-emitting circuit 102; a first light-emitting control circuit 116 configured to control the ON and OFF operations of the first light-emitting circuit 102, for instance, the first light-emitting control circuit 116 includes a first part 116A and a second part 116B; a second light-emitting circuit 118 configured to emit light in the working process; a second drive circuit 120 configured to drive the second light-emitting circuit 118; a second compensating circuit 122 configured to compensate the second drive circuit 120; a second data write circuit 124 configured to write data into the second drive circuit 120; a second reset circuit 126 configured to reset the second drive circuit 120; a second storage circuit 128 configured to store the driving voltage of the second drive circuit 120; a second initializing circuit 130 configured to initialize the second light-emitting circuit 118; a second light-emitting control circuit 132 configured to control the ON and OFF operations of the second light-emitting circuit 118, for instance, the second light-emitting control circuit 132 includes a first part 132A and a second part 132B; a third light-emitting circuit 134 configured to emit light in the working process; a third light-emitting control circuit 136 configured to control the ON and OFF operations of the third light-emitting circuit 134, for instance, the third light-emitting control circuit 136 includes a first part 136A and a second part 136B; a third drive circuit 138 configured to drive the third light-emitting circuit 134, for instance, the third drive circuit 138 includes a first part 138A and a second part 138B; a third initializing circuit 140 configured to initialize the third light-emitting circuit 134; a first power end ELVDD configured to provide a first luminous voltage Velvdd for the first light-emitting circuit 102, the second light-emitting circuit 118 and the third light-emitting circuit 134; a second power end ELVSS configured to provide a second luminous voltage Velvss for the first light-emitting circuit 102, the second light-emitting circuit 118 and the third light-emitting circuit 134; a third power end Vx configured to provide a reset voltage Vvx for the first reset circuit 110 and the second reset circuit 126; a first data signal end Data1 configured to provide a first data signal or a standby signal for the first data write circuit 108; a second data signal end Data2 configured to provide a second data signal or a standby signal for the second data write circuit 124; a first control end Sn−1 configured to provide a first control signal for controlling the ON and OFF operations of the first reset circuit 110 and the second reset circuit 126; a second control end Sn configured to provide a second control signal for controlling the ON and OFF operations of the first data write circuit 108, the first compensating circuit 106, the second data write circuit 124 and the second compensating circuit 122; a third control end Sn+1 configured to provide a third control signal for controlling the ON and OFF operations of the first initializing circuit 114, the second initializing circuit 130 and the third initializing circuit 140; and a fourth control end En configured to provide a fourth control signal for controlling the ON and OFF operations of the first light-emitting circuit 102, the second light-emitting control circuit 132, and the third light-emitting control circuit 136.

Figure 2:
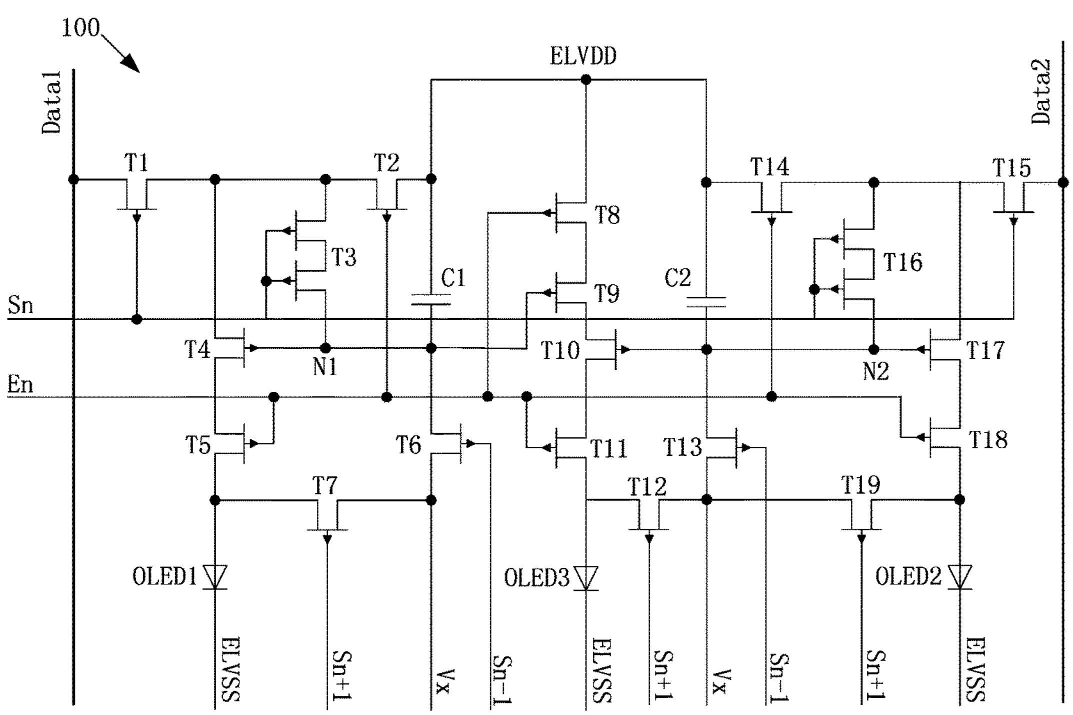
FIG. 2 is a second schematic diagram of a pixel circuit provided by an embodiment of the present disclosure.

For instance, FIG. 2 is a second schematic diagram of the pixel circuit provided by an embodiment of the present disclosure. FIG. 2 is a preferred embodiment of the pixel circuit as illustrated in FIG. 1. As illustrated in FIGS. 1 and 2, in the pixel circuit 100 provided by an embodiment of the present disclosure, the first data write circuit 108 includes a first transistor T1; the first light-emitting control circuit 116 includes a second transistor T2 and a fifth transistor T5, for instance, the first part 116A of the first light-emitting control circuit 116 includes the second transistor T2 and the second part 116B of the first light-emitting control circuit 116 includes the fifth transistor T5; the first compensating circuit 106 includes a third transistor T3; the first drive circuit 104 includes a fourth transistor T4; the first reset circuit 110 includes a sixth transistor T6; the first initializing circuit 114 includes a seventh transistor T7; the first storage circuit 112 includes a first storage capacitor C1; the first light-emitting circuit 102 includes a first organic light-emitting diode OLED1; the third light-emitting control circuit 136 includes an eighth transistor T8 and an eleventh transistor T11, for instance, the first part 136A of the third light-emitting control circuit 136 includes the eighth transistor T8 and the second part 136B of the third light-emitting control circuit 136 includes the eleventh transistor T11; the third drive circuit 138 includes a ninth transistor T9 and a tenth transistor T10, for instance, the first part 138A of the third drive circuit 138 includes the ninth transistor T9 and the second part 138B of the third drive circuit 138 includes the tenth transistor T10; the third initializing circuit 140 includes a twelfth transistor T12; the second reset circuit 126 includes a thirteenth transistor T13; the second light-emitting control circuit 132 includes a fourteenth transistor T14 and an eighteenth transistor T18, for instance, the first part 132A of the second light-emitting control circuit 132 includes the fourteenth transistor T14 and the second part 132B of the second light-emitting control circuit 132 includes the eighteenth transistor T18; the second data write circuit 124 includes a fifteenth transistor T15; the second compensating circuit 122 includes a sixteenth transistor T16; the second drive circuit 120 includes a seventeenth transistor T17; the second initializing circuit 130 includes a nineteenth transistor T19; the second storage circuit 128 includes a second storage capacitor C2; the second light-emitting circuit 118 includes a second organic light-emitting diode OLED2; and the third light-emitting circuit 134 includes a third organic light-emitting diode OLED3.

For instance, as illustrated in FIG. 2, the third transistor T3 includes a first sub-transistor and a second sub-transistor; a source electrode of the first sub-transistor is taken as a source electrode of the third transistor T3; a drain electrode of the first sub-transistor is electrically connected with a source electrode of the second sub-transistor; a drain electrode of the second sub-transistor is taken as a drain electrode of the third transistor T3; and a gate electrode of the first sub-transistor and a gate electrode of the second sub-transistor are electrically connected with each other to act as a gate electrode of the third transistor T3 together. The sixteenth transistor T16 includes a third sub-transistor and a fourth sub-transistor; a source electrode of the third sub-transistor is taken as a source electrode of the sixteenth transistor T16; a drain electrode of the third sub-transistor is electrically connected with a source electrode of the fourth sub-transistor; a drain electrode of the fourth sub-transistor is taken as a drain electrode of the sixteenth transistor T16; and a gate electrode of the third sub-transistor and a gate electrode of the fourth sub-transistor are electrically connected with each other to act as a gate electrode of the sixteenth transistor T16 together. The configuration of the third transistor T3 and the sixteenth transistor T16 can allow at least one of the first sub-transistor or the second sub-transistor to be in a saturation region and at least one of the third sub-transistor or the fourth sub-transistor to be in a saturation region. It should be noted that the embodiment of the present disclosure includes but not limited to the configuration of the third transistor T3 and the sixteenth transistor T16; the third transistor T3 may include one transistor only; and the sixteenth transistor T16 may also include one transistor only. Other transistors in the embodiment of the present disclosure may also be arranged with reference to the configuration of the third transistor T3 or the sixteenth transistor T16 according to actual demands, and similar modifications shall fall within the scope of protection of the present disclosure.

For instance, as illustrated in FIG. 2, in the pixel circuit 100 provided by an embodiment of the present disclosure, a source electrode of the first transistor T1 is electrically connected with the first data signal end Data1; a gate electrode of the first transistor T1 and a gate electrode of the third transistor T3 are electrically connected with the second control end Sn; a drain electrode of the first transistor T1, a drain electrode of the second transistor T2, a source electrode of the third transistor T3, and a source electrode of the fourth transistor T4 are electrically connected with each other; a gate electrode of the second transistor T2 and a gate electrode of the fifth transistor T5 are electrically connected with the fourth control end En; a source electrode of the second transistor T2 and a first end of the first storage capacitor C1 are electrically connected with the first power end ELVDD; a drain electrode of the third transistor T3 is electrically connected with a first node N1; a gate electrode of the fourth transistor T4 is electrically connected with the first node N1; a drain electrode of the fourth transistor T4 is electrically connected with a source electrode of the fifth transistor T5; a drain electrode of the fifth transistor T5 and a drain electrode of the seventh transistor T7 are electrically connected with a first end of the first organic light-emitting diode OLED1; a source electrode of the sixth transistor T6 and a source electrode of the seventh transistor T7 are electrically connected with the third power end Vx; a gate electrode of the sixth transistor T6 is electrically connected with the first control end Sn−1; a drain electrode of the sixth transistor T6 is electrically connected with the first node N1; a gate electrode of the seventh transistor T7 is electrically connected with the third control end Sn+1; a second end of the first storage capacitor C1 is electrically connected with the first node N1; a second end of the first organic light-emitting diode OLED1 is electrically connected with the second power end ELVSS; a source electrode of the eighth transistor T8 is electrically connected with the first power end ELVDD; a gate electrode of the eighth transistor T8 is electrically connected with the fourth control end En; a drain electrode of the eighth transistor T8 is electrically connected with a source electrode of the ninth transistor T9; a gate electrode of the ninth transistor T9 is electrically connected with the first node N1; a drain electrode of the ninth transistor T9 is electrically connected with a source electrode of the tenth transistor T10; a gate electrode of the tenth transistor T10 is electrically connected with a second node N2; a drain electrode of the tenth transistor T10 is electrically connected with a source electrode of the eleventh transistor T11; a gate electrode of the eleventh transistor T11 is electrically connected with the fourth control end En; a drain electrode of the eleventh transistor T11 and a first end of the third organic light-emitting diode OLED3 are electrically connected with a drain electrode of the twelfth transistor T12; a gate electrode of the twelfth transistor T12 is electrically connected with the third control end Sn+1; a source electrode of the twelfth transistor T12, a drain electrode of the thirteenth transistor T13 and a source electrode of the nineteenth transistor T19 are electrically connected with the third power end Vx; a source electrode of the thirteenth transistor T13 is electrically connected with the second node N2; a gate electrode of the thirteenth transistor T13 is electrically connected with the first control end Sn−1; a source electrode of the fourteenth transistor T14 and a first end of the second storage capacitor C2 are electrically connected with the first power end ELVDD; a gate electrode of the fourteenth transistor T14 and a gate electrode of the eighteenth transistor T18 are electrically connected with the fourth control end En; a drain electrode of the fourteenth transistor T14, a drain electrode of the fifteenth transistor T15, a source electrode of the sixteenth transistor T16, and a source electrode of the seventeenth transistor T17 are electrically connected with each other; a source electrode of the fifteenth transistor T15 is electrically connected with the second data signal end Data2; a gate electrode of the fifteenth transistor T15 and a gate electrode of the sixteenth transistor T16 are electrically connected with the second control end Sn; a drain electrode of the sixteenth transistor T16 is electrically connected with the second node N2; a gate electrode of the seventeenth transistor T17 is electrically connected with the second node N2; a drain electrode of the seventeenth transistor T17 is electrically connected with a source electrode of the eighteenth transistor T18; a drain electrode of the eighteenth transistor T18 and a drain electrode of the nineteenth transistor T19 are electrically connected with a first end of the second organic light-emitting diode OLED2; a gate electrode of the nineteenth transistor T19 is electrically connected with the third control end Sn+1; a second end of the second storage capacitor C2 is electrically connected with the second node N2; a second end of the second organic light-emitting diode OLED2 is electrically connected with the second power end ELVSS; and a second end of the third organic light-emitting diode OLED3 is electrically connected with the second power end ELVSS.

For instance, in the pixel circuit provided by an embodiment of the present disclosure, the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10, the eleventh transistor T11, the twelfth transistor T12, the thirteenth transistor T13, the fourteenth transistor T14, the fifteenth transistor T15, the sixteenth transistor T16, the seventeenth transistor T17, the eighteenth transistor T18, and the nineteenth transistor T19 are all TFTs.

For instance, in the pixel circuit provided by an embodiment of the present disclosure, the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10, the eleventh transistor T11, the twelfth transistor T12, the thirteenth transistor T13, the fourteenth transistor T14, the fifteenth transistor T15, the sixteenth transistor T16, the seventeenth transistor T17, the eighteenth transistor T18, and the nineteenth transistor T19 are all P-type transistors.

It should be noted that the transistors adopted in the embodiment of the present disclosure may all be TFTs or field-effect transistors (FETs) or other switching elements with the same characteristics. The source electrode and the drain electrode of a transistor adopted here may be symmetrical in structure, so the source electrode and the drain electrode of the transistor may have no difference in structure. In the embodiments of the present disclosure, in order to distinguish two electrodes of the transistor except the gate electrode, one electrode is directly described as the source electrode and the other electrode is directly described as the drain electrode, so the source electrodes and the drain electrodes of all the or some transistors in the embodiments of the present disclosure may be exchanged as required. In addition, transistors may be divided into N-type transistors and P-type transistors according to the characteristics of the transistors. Description is given in the embodiment of the present disclosure by taking the case that the transistors are all P-type transistors as an example. The implementation that the embodiment of the present disclosure adopts N-type transistors can be easily conceived of by those skilled in the art without creative efforts on the basis of the description and instruction on the implementation of the P-type transistors in the present disclosure. Therefore, the implementations shall also fall within the scope of protection of the present disclosure.

For instance, in the pixel circuit 100 provided by an embodiment of the present disclosure, the first organic light-emitting diode OLED1 emits light of first color in the working process; the second organic light-emitting diode OLED2 emits light of second color in the working process; the third organic light-emitting diode OLED3 emits light of third color in the working process; and a mixed color of the light of the first color and the light of the second color is the third color.

For instance, in one example of the pixel circuit 100 provided by an embodiment of the present disclosure, the light of the first color is red light; the light of the second color is green light; and the light of the third color is yellow light. A mixed color of red and green is yellow.

For instance, the pixel circuit 100 simultaneously controls the first organic light-emitting diode OLED1, the second organic light-emitting diode OLED2 and the third organic light-emitting diode OLED3, reduces the number of the pixel circuits as a whole, reduces the area occupied by the pixel circuit, and improves the resolution of the display panel.

For instance, when the pixel circuit 100 operates, the first organic light-emitting diode OLED1 and the second organic light-emitting diode OLED2 can emit light independently, or the first organic light-emitting diode OLED1, the second organic light-emitting diode OLED2 and the third organic light-emitting diode OLED3 may emit light simultaneously.

For instance, according to different display frames, the brightness of the third organic light-emitting diode OLED3 may be adopted to replace the combined brightness of the first organic light-emitting diode OLED1 and the second organic light-emitting diode OLED2. In a display frame in which the third organic light-emitting diode OLED3 is required to emit light, the first organic light-emitting diode OLED1, the second organic light-emitting diode OLED2 and the third organic light-emitting diode OLED3 emit light simultaneously, which is equivalent to increase the area of luminescent materials of the first organic light-emitting diode OLED1 and the second organic light-emitting diode OLED2 and reduce the luminous brightness of the first organic light-emitting diode OLED1 and the second organic light-emitting diode OLED2. Thus, the aging of organic functional materials in the first organic light-emitting diode OLED1 and the second organic light-emitting diode OLED2 can be decelerated, and the service life of the first organic light-emitting diode OLED1 and the second organic light-emitting diode OLED2 can be prolonged.

For instance, in the pixel circuit 100 provided by an embodiment of the present disclosure, the threshold voltage of the fourth transistor T4 is equal to the threshold voltage of the ninth transistor T9, and the threshold voltage of the tenth transistor T10 is equal to the threshold voltage of the seventeenth transistor T17. Thus, when the first organic light-emitting diode OLED1, the second organic light-emitting diode OLED2 and the third organic light-emitting diode OLED3 emit light simultaneously, the luminous brightness of the third organic light-emitting diode OLED3 is the same as the brightness of the OLED with low brightness out of the first organic light-emitting diode OLED1 and the second organic light-emitting diode OLED2.

The embodiment of the present disclosure further provides a driving method of the pixel circuit as illustrated in FIG. 2. The driving method comprises: a reset period, a compensation period, an initialization period and an emission period. In the reset period, the first control end Sn−1 emits a valid signal; the second control end Sn outputs an invalid signal; the third control end Sn+1 outputs an invalid signal; the fourth control end En outputs an invalid signal; the first data signal end Data1 outputs a standby signal; and the second data signal Data2 outputs a standby signal. In the compensation period, the first control end Sn−1 emits an invalid signal; the second control end Sn outputs a valid signal; the third control end Sn+1 outputs an invalid signal; the fourth control end En outputs an invalid signal; the first data signal end Data1 outputs a first data signal, and the second data signal Data2 outputs a standby signal; alternatively, the first data signal end Data1 outputs a standby signal, and the second data signal Data2 outputs a second data signal; alternatively, the first data signal end Data1 outputs the first data signal, and the second data signal Data2 outputs the second data signal. In the initialization period, the first control end Sn−1 emits an invalid signal; the second control end Sn outputs an invalid signal; the third control end Sn+1 outputs a valid signal; the fourth control end En outputs an invalid signal; the first data signal end Data1 outputs a standby signal; and the second data signal Data2 outputs a standby signal. In the emission period, the first control end Sn−1 emits an invalid signal; the second control end Sn outputs an invalid signal; the third control end Sn+1 outputs an invalid signal; the fourth control end En outputs a valid signal; the first data signal end Data1 outputs a standby signal; and the second data signal Data2 outputs a standby signal.

For instance, the driving method provided by an embodiment of the present disclosure may further comprise: a pre-reset period and a pre-emission period. The pre-reset period is after the emission period and before the reset period, and the pre-emission period is after the initialization period and before the emission period. In the pre-reset period, the first control end Sn−1 emits an invalid signal; the second control end Sn outputs an invalid signal; the third control end Sn+1 outputs an invalid signal; the fourth control end En outputs an invalid signal; the first data signal end Data1 outputs a standby signal; and the second data signal Data2 outputs a standby signal. In the pre-emission period, the first control end Sn−1 emits an invalid signal; the second control end Sn outputs an invalid signal; the third control end Sn+1 outputs an invalid signal; the fourth control end En outputs an invalid signal; the first data signal end Data1 outputs a standby signal; and the second data signal Data2 outputs a standby signal.

For instance, in the driving method provided by an embodiment of the present disclosure, in the compensation period, when the first data signal Data1 outputs the first data signal and the second data signal end Data2 outputs the standby signal, the first light-emitting circuit 102 emits light independently, and the first data signal is configured to control the luminous brightness of the first light-emitting circuit 102; when the first data signal end Data1 outputs the standby signal and the second data signal end Data2 outputs the second data signal, the second light-emitting circuit 118 emits light independently, and the second data signal is configured to control the luminous brightness of the second light-emitting circuit 118; and when the first data signal end Data1 outputs the first data signal and the second data signal end Data2 outputs the second data signal, the first light-emitting circuit 102, the second light-emitting circuit 118 and the third light-emitting circuit 134 emit light simultaneously; the first data signal is configured to control the luminous brightness of the first light-emitting circuit 102; the second data signal is configured to control the luminous brightness of the second light-emitting circuit 118; and a smaller data signal in the first data signal and the second data signal is configured to control the luminous brightness of the third light-emitting circuit 134.

It should be noted that a valid signal in the embodiments of the present disclosure refers to a signal capable of switching on corresponding circuit or transistor; an invalid signal refers to a signal capable of switching off corresponding circuit or transistor; the first data signal or the second data signal refers to a signal including luminous brightness information of corresponding light-emitting circuit or OLED (for instance, a low level signal); and the standby signal refers to a signal capable of disabling the light emission of corresponding light-emitting circuit or OLED (for instance, a high level signal). For instance, as for the case the transistors are P-type transistors, the valid signal refers to a low level signal and the invalid signal refers to a high level signal. The specific voltage of the low level signal and the high level signal may be correspondingly set according to the properties of the transistors. Description will be given below in the embodiments of the present disclosure by taking the case that the transistors are all P-type transistors as an example.

Figure 3:
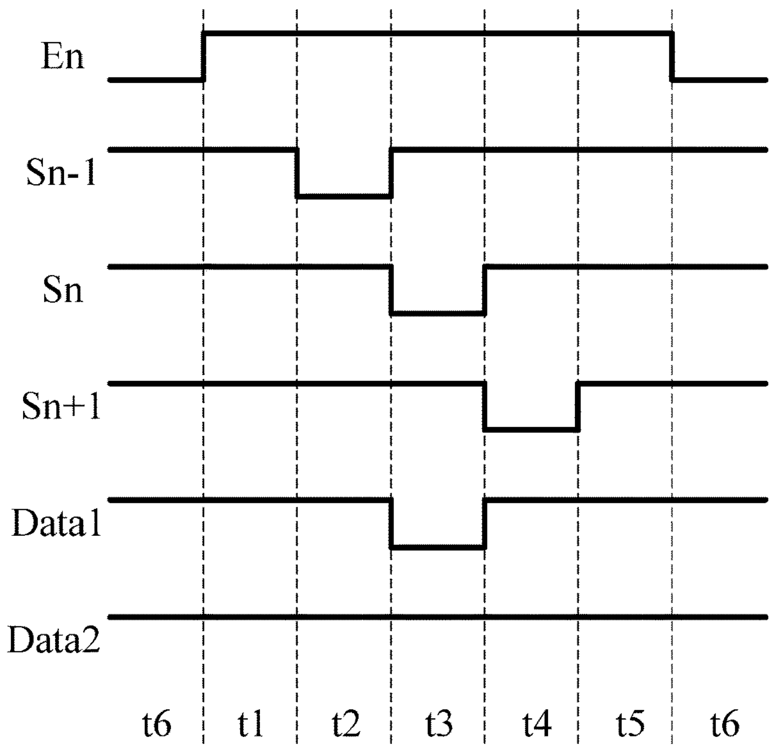
FIG. 3 is a drive timing diagram of the pixel circuit as illustrated in FIG. 2 provided by an embodiment of the present disclosure when a first OLED emits light independently.

For instance, FIG. 3 is a drive timing diagram of the pixel circuit as illustrated in FIG. 2 provided by an embodiment of the present disclosure when the first OLED emits light independently. As illustrated in FIG. 3, the embodiment of the present disclosure provides a driving method of the pixel circuit as illustrated in FIG. 2, which comprises: a pre-reset period t1, a reset period t2, a compensation period t3, an initialization period t4, a pre-emission period t5, and an emission period t6.

For instance, in the pre-reset period t1, the first control end Sn−1 outputs a high level signal; the second control end Sn outputs a high level signal; the third control end Sn+1 outputs a high level signal; the fourth control end En outputs a high level signal; the first data signal end Data1 outputs a high level signal; and the second data signal end Data2 outputs a high level signal.

Figure 4A:
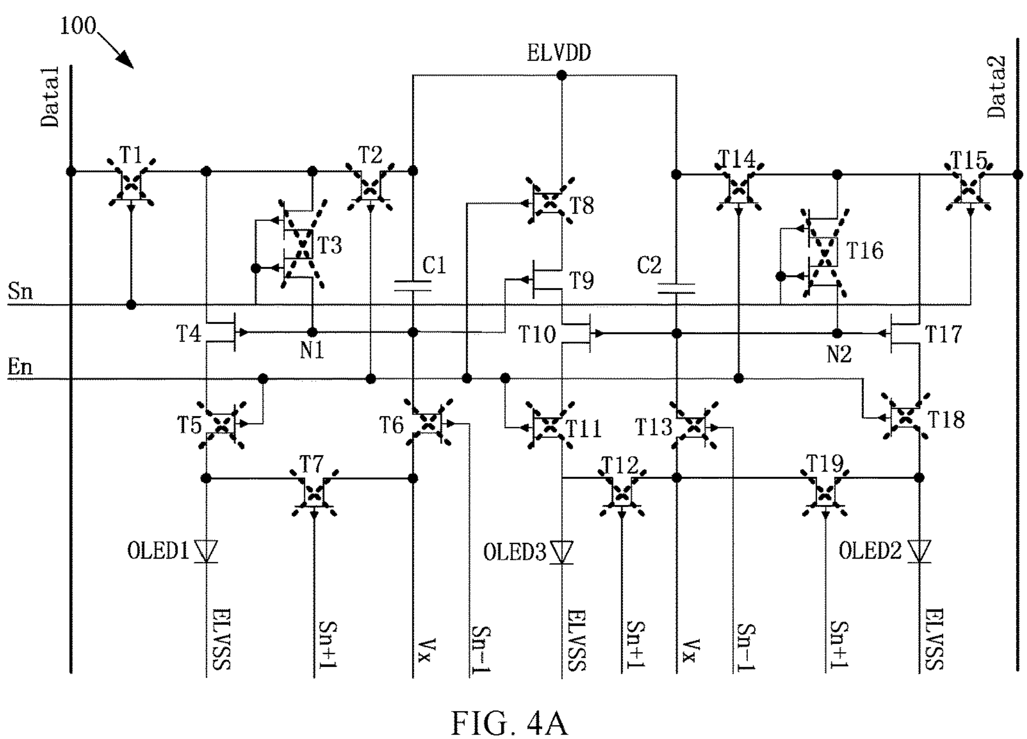
FIG. 4A is a schematic diagram illustrating the conduction state in the pre-reset period when the pixel circuit as illustrated in FIG. 2 provided by an embodiment of the present disclosure is driven by the drive timing as illustrated in FIG. 3.

For instance, FIG. 4A is a schematic diagram illustrating the conduction state in the pre-reset period t1 when the pixel circuit as illustrated in FIG. 2 provided by an embodiment of the present disclosure is driven by the drive timing as illustrated in FIG. 3. In the pre-reset period t1, the first transistor T1, the second transistor T2, the third transistor T3, the fifth transistor T5, the sixth transistor T6, the seventh transistor T7, the eighth transistor T8, the eleventh transistor T11, the twelfth transistor T12, the thirteenth transistor T13, the fourteenth transistor T14, the fifteenth transistor T15, the sixteenth transistor T16, the eighteenth transistor T18 and the nineteenth transistor T19 are all in the off-states, and no electrical current path is formed in the pixel circuit; and the conduction states of the fourth transistor T4, the ninth transistor T9, the tenth transistor T10 and the seventeenth transistor T17 are relevant to the voltages of the first node N1 and the second node N2. For instance, the pre-reset period can provide a stable time period for the pixel circuit, so that the voltage and the current of various circuit elements can be kept in a stable state, and hence the circuit abnormality can be avoided.

For instance, in the reset period t2, the first control end Sn−1 outputs a low level signal; the second control end Sn outputs a high level signal; the third control end Sn+1 outputs a high level signal; the fourth control end En outputs a high level signal; the first data signal end Data1 outputs a high level signal; and the second data signal end Data2 outputs a high level signal.

Figure 4B:
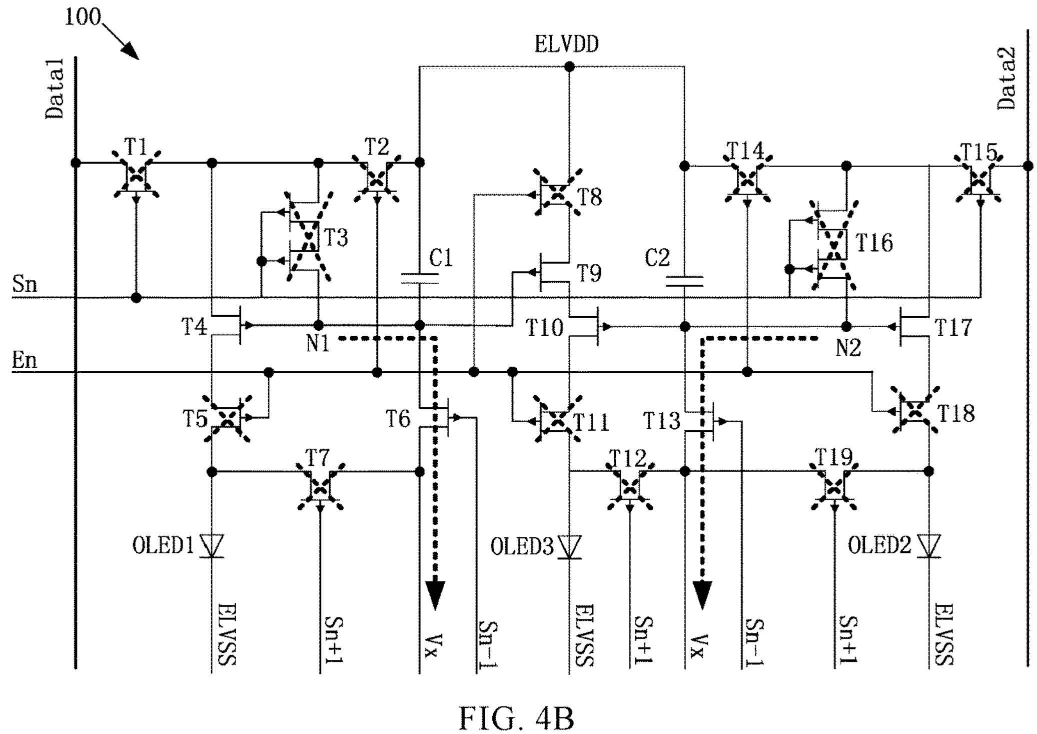
FIG. 4B is a schematic diagram illustrating the conduction state in the reset period when the pixel circuit as illustrated in FIG. 2 provided by an embodiment of the present disclosure is driven by the drive timing as illustrated in FIG. 3.

FIG. 4B is a schematic diagram illustrating the conduction state in the reset period t2 when the pixel circuit as illustrated in FIG. 2 provided by an embodiment of the present disclosure is driven by the drive timing as illustrated in FIG. 3. In the reset period t2, the first transistor T1, the second transistor T2, the third transistor T3, the fifth transistor T5, the seventh transistor T7, the eighth transistor T8, the eleventh transistor T11, the twelfth transistor T12, the fourteenth transistor T14, the fifteenth transistor T15, the sixteenth transistor T16, the eighteenth transistor T18, and the nineteenth transistor T19 are all in the off-states. Because the first control end Sn−1 outputs the low level signal, the sixth transistor T6 and the thirteenth transistor T13 are switched on; the voltages of the first node N1 and the second node N2 are the reset voltage Vvx provided by the third power end Vx; and the reset voltage Vvx is, for instance, a low level voltage capable of switching on the P-type transistor, or for instance, the reset voltage Vvx is a negative voltage. At this point, as the voltages of the first node N1 and the second node N2 are the low-level reset voltage Vvx, the fourth transistor T4, the ninth transistor T9, the tenth transistor T10 and the seventeenth transistor T17 are switched on, but no electrical current path is formed. Thus, the fourth transistor T4 and the ninth transistor T9 can be reset through the sixth transistor T6, and the tenth transistor T10 and the seventeenth transistor T17 can be reset through the thirteenth transistor T13. That is to say, the first reset circuit resets the first drive circuit; the second reset circuit resets the second drive circuit; and the first reset circuit and the second reset circuit reset the third drive circuit together. For instance, the voltage difference between the first node N1 and the first data signal Vdata1 can be increased after the reset period, so that the charging time for the first storage capacitor C1 can be reduced in the compensation period t3.

For instance, in the compensation period t3, the first control end Sn−1 outputs a high level signal; the second control end Sn outputs a low level signal; the third control end Sn+1 outputs a high level signal; the fourth control end En outputs a high level signal; the first data signal end Data1 outputs a first data signal Vdata1 (for instance, a low level signal); and the second data signal end Data2 outputs a high level signal.

Figure 4C:
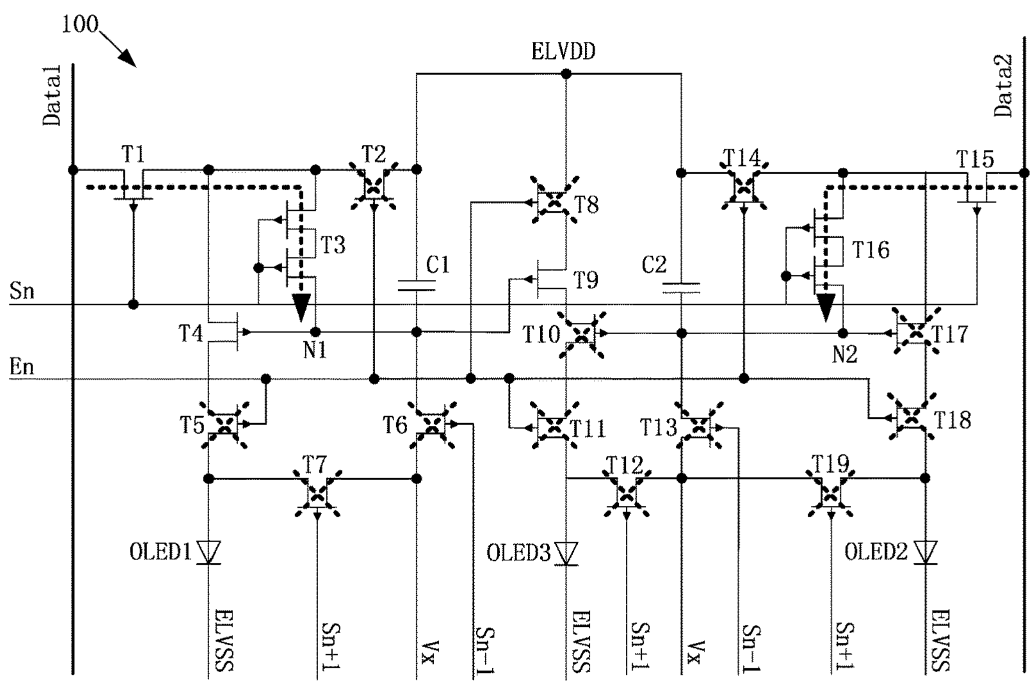
FIG. 4C is a schematic diagram illustrating the conduction state in the compensation period when the pixel circuit as illustrated in FIG. 2 provided by an embodiment of the present disclosure is driven by the drive timing as illustrated in FIG. 3.

FIG. 4C is a schematic diagram illustrating the conduction state when the pixel circuit as illustrated in FIG. 2 provided by an embodiment of the present disclosure is driven by the drive timing as illustrated in FIG. 3. In the compensation period t3, the second transistor T2, the fifth transistor T5, the sixth transistor T6, the seventh transistor T7, the eighth transistor T8, the tenth transistor T10, the eleventh transistor T11, the twelfth transistor T12, the thirteenth transistor T13, the fourteenth transistor T14, the seventeenth transistor T17, the eighteenth transistor T18, and the nineteenth transistor T19 are all in the off-states. As the second control end Sn outputs the low level signal, the first transistor T1, the third transistor T3, the fifteenth transistor T15, and the sixteenth transistor T16 are switched on; the first data signal Vdata1 outputted by the first data signal end Data1 is transmitted to the first node N1 through the first transistor T1 and the third transistor T3; after the first storage capacitor C1 is charged, the voltage of the first node N1 is Vdata1+Vth1 (Vth1 is the overall pressure drop of the first transistor T1 and the third transistor T3), namely the first data write circuit writes data into the first drive circuit, and the first compensating circuit compensates the first drive circuit; at this point, the fourth transistor T4 and the ninth transistor T9 are switched on, but no electrical current path is formed; the high level signal outputted by the second data signal end Data2 is transmitted to the second node N2 through the fifteenth transistor T15 and the sixteenth transistor T16; and the voltage of the second node N2 is in high level, so the tenth transistor T10 and the seventeenth transistor T17 are in the off-state.

For instance, in the initialization period t4, the first control end Sn−1 outputs a high level signal; the second control end Sn outputs a high level signal; the third control end Sn+1 outputs a low level signal; the fourth control end En outputs a high level signal; the first data signal end Data1 outputs a high level signal; and the second data signal end Data2 outputs a high level signal.

For instance, the initialization electrical discharge on the OLED(s) ensures the accuracy under a low gray scale and full black under a full dark frame, and effectively improves the contrast of the entire display panel.

Figure 4D:
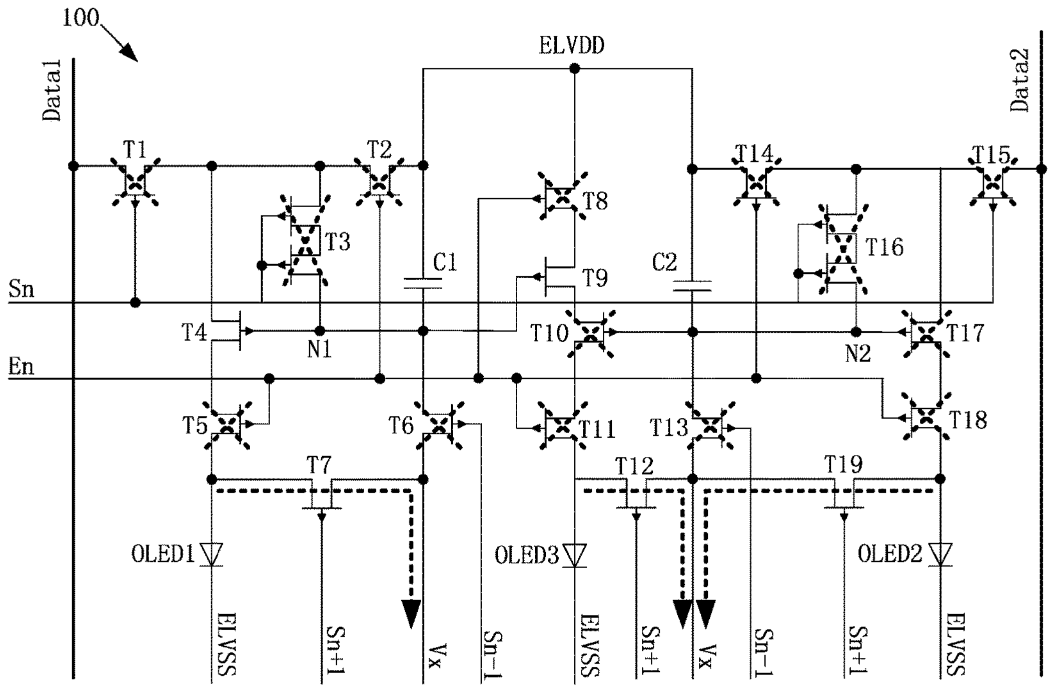
FIG. 4D is a schematic diagram illustrating the conduction state in the initialization period when the pixel circuit as illustrated in FIG. 2 provided by an embodiment of the present disclosure is driven by the drive timing as illustrated in FIG. 3.

FIG. 4D is a schematic diagram illustrating the conduction state in the initialization period t4 when the pixel circuit as illustrated in FIG. 2 provided by an embodiment of the present disclosure is driven by the drive timing as illustrated in FIG. 3. In the initialization period t4, the first transistor T1, the second transistor T2, the third transistor T3, the fifth transistor T5, the sixth transistor T6, the eighth transistor T8, the tenth transistor T10, the eleventh transistor T11, the thirteenth transistor T13, the fourteenth transistor T14, the fifteenth transistor T15, the sixteenth transistor T16, the seventeenth transistor T17, and the eighteenth transistor T18 are all in the off-states. Because of the voltage storage function of the first storage capacitor C1, the fourth transistor T4 and the ninth transistor T9 are kept in the on-state the same state as that in the compensation period t3; as the third control end Sn+1 outputs the low level signal, the seventh transistor T7, the twelfth transistor T12 and the nineteenth transistor T19 are switched on; the reset voltage Vvx provided by the third power end Vx is transmitted to a first electrode (the first electrode is, for instance, an anode) of the first organic light-emitting diode OLED1 through the seventh transistor T7; the reset voltage Vvx provided by the third power end Vx is transmitted to a first electrode (the first electrode is, for instance, an anode) of the third organic light-emitting diode OLED3 through the twelfth transistor T12; and the reset voltage Vvx provided by the third power end Vx is transmitted to a first electrode (the first electrode is, for instance, an anode) of the second organic light-emitting diode OLED2 through the nineteenth transistor T19. That is to say, the first initializing circuit initializes the first light-emitting circuit; the second initializing circuit initializes the second light-emitting circuit; and the third initializing circuit initializes the third light-emitting circuit. For instance, the reset voltage Vvx is less than or equal to the second luminous voltage Velvss provided by the second power end ELVSS. Thus, the abnormal emission of the OLEDs can be prevented by initialization, and for instance, the slightly bright emission of the OLEDs in the non-luminous period can be avoided.

For instance, in the pre-emission period t5, the first control end Sn−1 outputs a high level signal; the second control end Sn outputs a high level signal; the third control end Sn+1 outputs a high level signal; the fourth control end En outputs a high level signal; the first data signal end Data1 outputs a high level signal; and the second data signal end Data2 outputs a high level signal.

Figure 4E:
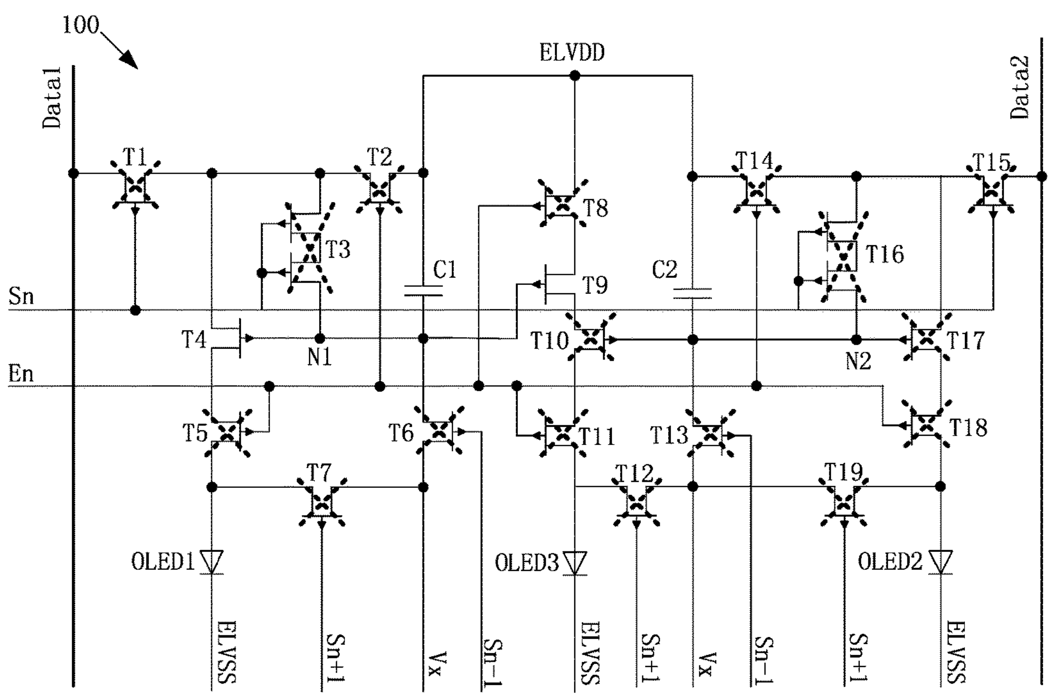
FIG. 4E is a schematic diagram illustrating the conduction state in the pre-emission period when the pixel circuit as illustrated in FIG. 2 provided by an embodiment of the present disclosure is driven by the drive timing as illustrated in FIG. 3.

FIG. 4E is a schematic diagram illustrating the conduction state in the pre-emission period t5 when the pixel circuit as illustrated in FIG. 2 provided by an embodiment of the present disclosure is driven by the drive timing as illustrated in FIG. 3. In the pre-emission period t5, the first transistor T1, the second transistor T2, the third transistor T3, the fifth transistor T5, the sixth transistor T6, the seventh transistor T7, the eighth transistor T8, the tenth transistor T10, the eleventh transistor T11, the twelfth transistor T12, the thirteenth transistor T13, the fourteenth transistor T14, the fifteenth transistor T15, the sixteenth transistor T16, the seventeenth transistor T17, the eighteenth transistor T18, and the nineteenth transistor T19 are all in the off-states, and no electrical current path is formed in the pixel circuit. Because of the voltage storage function of the first storage capacitor C1, the fourth transistor T4 and the ninth transistor T9 are kept in the on-state the same as that in the initialization period t4. For instance, the pre-emission period can provide a stable time period for the pixel circuit, so that the voltage and the current of various circuit elements can be kept in the stable state, and hence the circuit abnormality can be avoided.

For instance, in the emission period t6, the first control end Sn−1 outputs a high level signal; the second control end Sn outputs a high level signal; the third control end Sn+1 outputs a high level signal; the fourth control end En outputs a low level signal; the first data signal end Data1 outputs a high level signal; and the second data signal end Data2 outputs a high level signal.

Figure 4F:
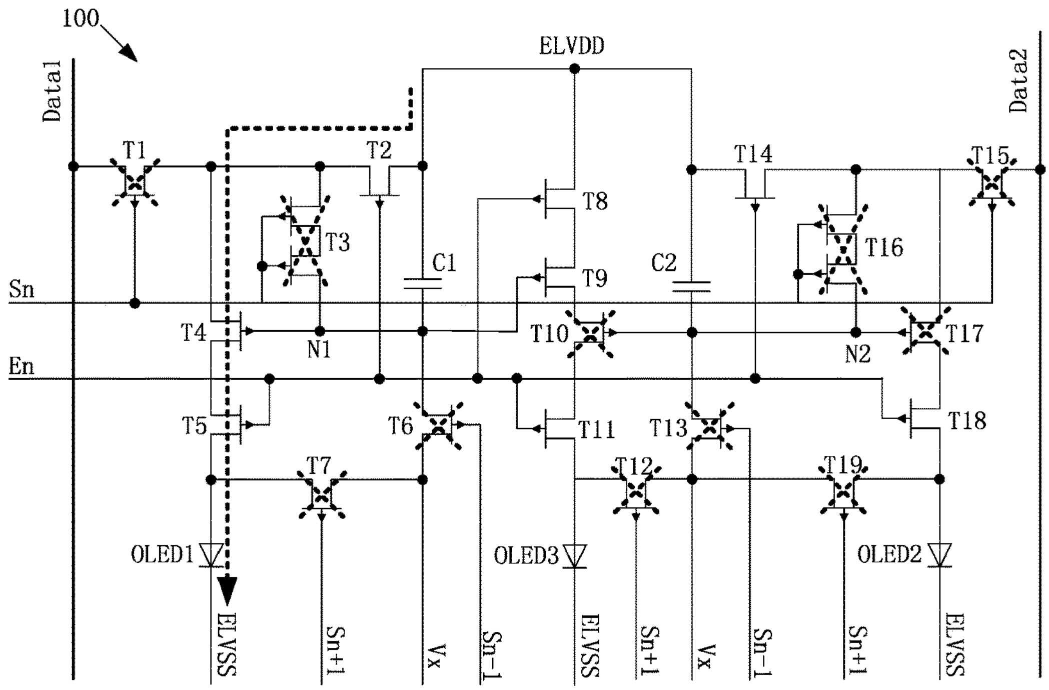
FIG. 4F is a schematic diagram illustrating the conduction state in the emission period when the pixel circuit as illustrated in FIG. 2 provided by an embodiment of the present disclosure is driven by the drive timing as illustrated in FIG. 3.

FIG. 4F is a schematic diagram illustrating the conduction state in the emission period t6 when the pixel circuit as illustrated in FIG. 2 provided by an embodiment of the present disclosure is driven by the drive timing as illustrated in FIG. 3. In the emission period t6, the first transistor T1, the third transistor T3, the sixth transistor T6, the seventh transistor T7, the tenth transistor T10, the twelfth transistor T12, the thirteenth transistor T13, the fifteenth transistor T15, the sixteenth transistor T16, the seventeenth transistor T17 and the nineteenth transistor T19 are all in the off-states. Because of the voltage storage function of the first storage capacitor C1, the fourth transistor T4 and the ninth transistor T9 are kept in the on-state the same as that in the pre-emission period t5. As the fourth control end En outputs the low level signal, the second transistor T2, the fifth transistor T5, the eighth transistor T8, the eleventh transistor T11, the fourteenth transistor T14 and the eighteenth transistor T18 are in the on-states; an electrical current path is formed by the first power end ELVDD, the second transistor T2, the fourth transistor T4, the fifth transistor T5, the first organic light-emitting diode OLED1 and the second power end ELVSS; and the first organic light-emitting diode OLED1 is driven by the fourth transistor T4 to emit light under the action of the first luminous voltage Velvdd provided by the first power end ELVDD and the second luminous voltage Velvss provided by the second power end ELVSS. That is to say, the first light-emitting control circuit controls the operation of the first light-emitting circuit; the first power end provides the first luminous voltage for the first light-emitting circuit; the second power end provides the second luminous voltage for the first light-emitting circuit; the first drive circuit drives the first light-emitting circuit; and the first light-emitting circuit emits light in the working process.

It should be noted that the driving method of the pixel circuit as illustrated in FIG. 2 may only comprise the reset period t2, the compensation period t3, the initialization period t4, and the emission period t6 and does not comprise the pre-reset period t1 and the pre-emission period t5, or comprises one of the pre-reset period t1 and the pre-emission period t5. No limitation will be given here.

For instance, the case that the second OLED emits light independently is similar to the case that the first OLED emits light independently. No further description will be given here.

Figure 5:
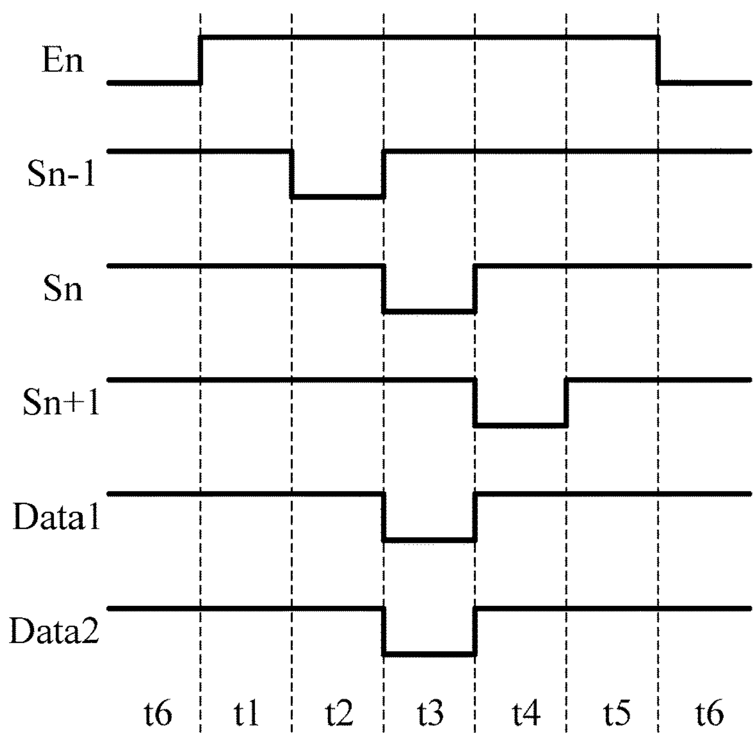
FIG. 5 is a drive timing diagram of the pixel circuit as illustrated in FIG. 2 provided by an embodiment of the present disclosure when a first OLED, a second OLED and a third OLED emit light simultaneously.

FIG. 5 is a drive timing diagram of the pixel circuit as illustrated in FIG. 2 provided by an embodiment of the present disclosure when the first OLED, the second OLED and the third OLED emit light simultaneously. As illustrated in FIG. 5, the embodiment of the present disclosure provides a driving method of the pixel circuit as illustrated in FIG. 2, which comprises: a pre-reset period t1, a reset period t2, a compensation period t3, an initialization period t4, a pre-emission period t5 and an emission period t6.

For instance, in the pre-reset period t1, the first control end Sn−1 outputs a high level signal; the second control end Sn outputs a high level signal; the third control end Sn+1 outputs a high level signal; the fourth control end En outputs a high level signal; the first data signal end Data1 outputs a high level signal; and the second data signal end Data2 outputs a high level signal.

Figure 6A:
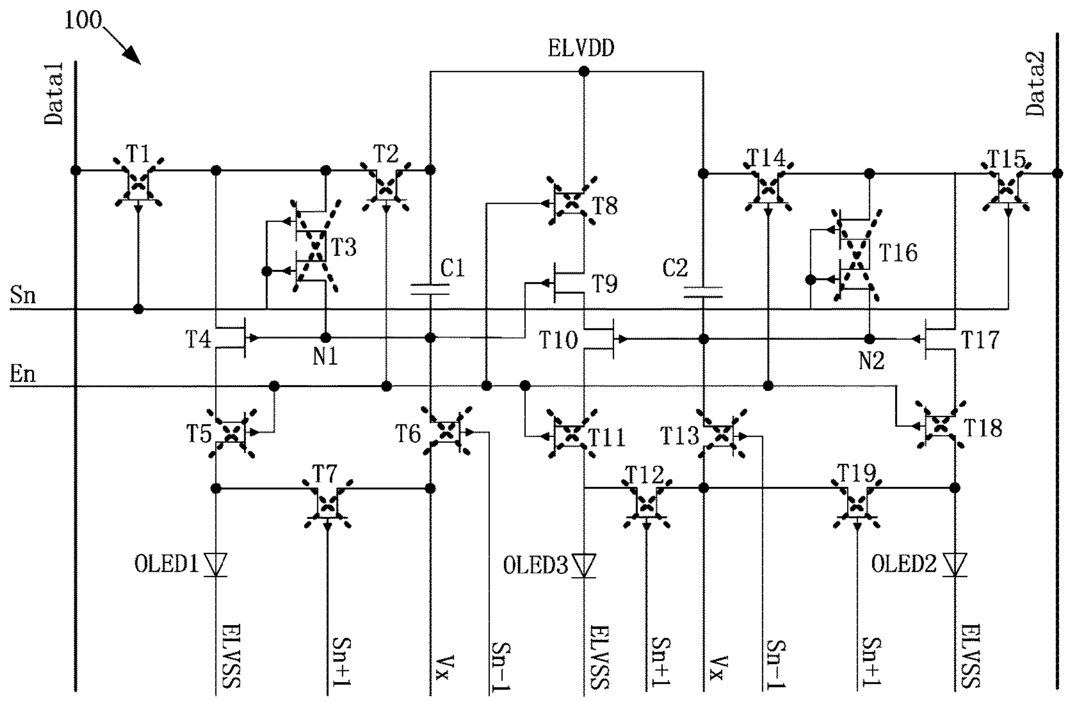
FIG. 6A is a schematic diagram illustrating the conduction state in the pre-reset period when the pixel circuit as illustrated in FIG. 2 provided by an embodiment of the present disclosure is driven by the drive timing as illustrated in FIG. 5.

FIG. 6A is a schematic diagram illustrating the conduction state in the pre-reset period when the pixel circuit as illustrated in FIG. 2 provided by an embodiment of the present disclosure is driven by the drive timing as illustrated in FIG. 5. In the pre-reset period t1, the first transistor T1, the second transistor T2, the third transistor T3, the fifth transistor T5, the sixth transistor T6, the seventh transistor T7, the eighth transistor T8, the eleventh transistor T11, the twelfth transistor T12, the thirteenth transistor T13, the fourteenth transistor T14, the fifteenth transistor T15, the sixteenth transistor T16, the eighteenth transistor T18, and the nineteenth transistor T19 are all in the off-states, and no electrical current path is formed in the pixel circuit; and the conduction state of the fourth transistor T4, the ninth transistor T9, the tenth transistor T10 and the seventeenth transistor T17 is relevant to the voltages of the first node N1 and the second node N2. For instance, the pre-reset period can provide a stable time period for the pixel circuit, so that the voltage and the current of various circuit elements can be kept in a stable state, and hence the circuit abnormality can be avoided.

For instance, in the reset period t2, the first control end Sn−1 outputs a low level signal; the second control end Sn outputs a high level signal; the third control end Sn+1 outputs a high level signal; the fourth control end En outputs a high level signal; the first data signal end Data1 outputs a high level signal; and the second data signal end Data2 outputs a high level signal.

Figure 6B:
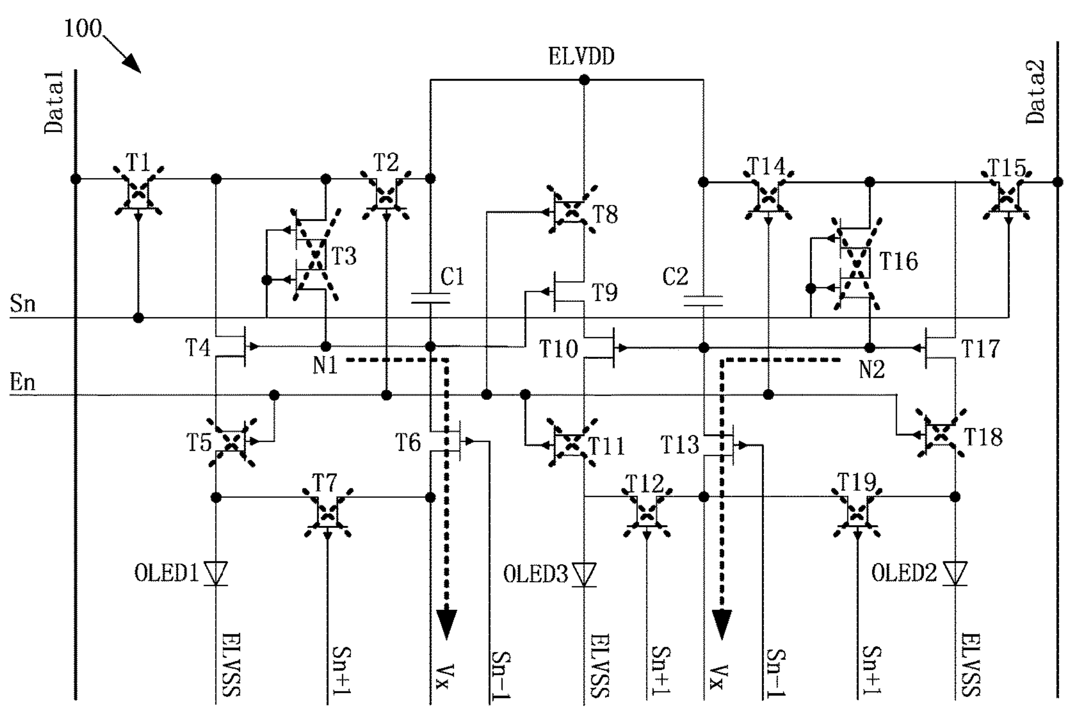
FIG. 6B is a schematic diagram illustrating the conduction state in the reset period when the pixel circuit as illustrated in FIG. 2 provided by an embodiment of the present disclosure is driven by the drive timing as illustrated in FIG. 5.

FIG. 6B is a schematic diagram illustrating the conduction state in the reset period when the pixel circuit as illustrated in FIG. 2 provided by an embodiment of the present disclosure is driven by the drive timing as illustrated in FIG. 5. In the reset period t2, the first transistor T1, the second transistor T2, the third transistor T3, the fifth transistor T5, the seventh transistor T7, the eighth transistor T8, the eleventh transistor T11, the twelfth transistor T12, the fourteenth transistor T14, the fifteenth transistor T15, the sixteenth transistor T16, the eighteenth transistor T18, and the nineteenth transistor T19 are all in the off-states. As the first control end Sn−1 outputs the low level signal, the sixth transistor T6 and the thirteenth transistor T13 are switched on; the voltages of the first node N1 and the second node N2 is the reset voltage Vvx provided by the third power end Vx; the reset voltage Vvx is, for instance, a low level voltage capable of switching on the P-type transistor, or for instance, the reset voltage Vvx is a negative voltage; and at this point, as the voltages of the first node N1 and the second node N2 are the low-level reset voltage Vvx, the fourth transistor T4, the ninth transistor T9, the tenth transistor T10, and the seventeenth transistor T17 are switched on, but no electrical current path is formed. Thus, the fourth transistor T4 and the ninth transistor T9 can be reset through the sixth transistor T6, and the tenth transistor T10 and the seventeenth transistor T17 can be reset through the thirteenth transistor T13. That is to say, the first reset circuit resets the first drive circuit; the second reset circuit resets the second drive circuit; and the first reset circuit and the second reset circuit reset the third drive circuit together. For instance, after the reset period, the voltage difference between the first node N1 and the first data signal Vdata1 can be increased, and the voltage difference between the second node N2 and the second data signal Vdata2 can be increased, so that the charging time of the first storage capacitor C1 and the second storage capacitor C2 can be reduced in the compensation period t3.

For instance, in the compensation period t3, the first control end Sn−1 outputs a high level signal; the second control end Sn outputs a low level signal; the third control end Sn+1 outputs a high level signal; the fourth control end En outputs a high level signal; the first data signal end Data1 outputs a first data signal Vdata1 (e.g., a low level signal); and the second data signal end Data2 outputs a second data signal Vdata2 (e.g., a low level signal).

Figure 6C:
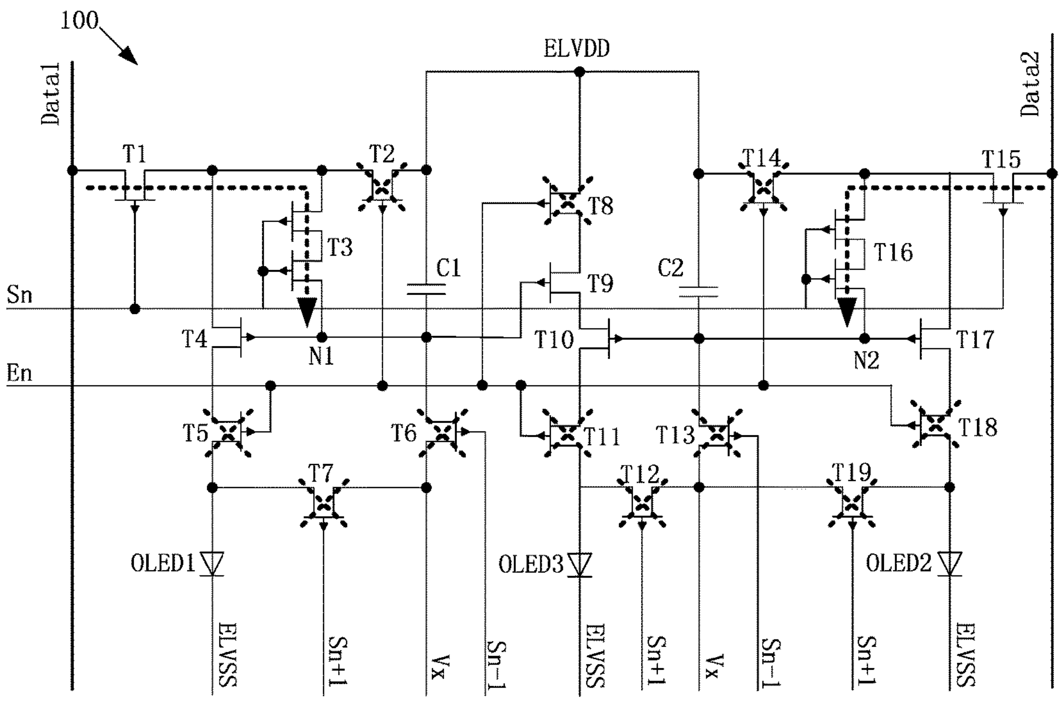
FIG. 6C is a schematic diagram illustrating the conduction state in the compensation period when the pixel circuit as illustrated in FIG. 2 provided by an embodiment of the present disclosure is driven by the drive timing as illustrated in FIG. 5.

FIG. 6C is a schematic diagram illustrating the conduction state in the compensation period when the pixel circuit as illustrated in FIG. 2 provided by an embodiment of the present disclosure is driven by the drive timing as illustrated in FIG. 5. In the compensation period t3, the second transistor T2, the fifth transistor T5, the sixth transistor T6, the seventh transistor T7, the eighth transistor T8, the tenth transistor T10, the eleventh transistor T11, the twelfth transistor T12, the thirteenth transistor T13, the fourteenth transistor T14, the seventeenth transistor T17, the eighteenth transistor T18, and the nineteenth transistor T19 are all in the off-states. As the second control end Sn outputs the low level signal, the first transistor T1, the third transistor T3, the fifteenth transistor T15 and the sixteenth transistor T16 are switched on; the first data signal Vdata1 outputted by the first data signal end Data1 is transmitted to the first node N1 through the first transistor T1 and the third transistor T3; after the first storage capacitor C1 is charged, the voltage of the first node N1 is Vdata1+Vth1 (Vth1 is the overall pressure drop of the first transistor T1 and the third transistor T3), that is, the first data write circuit writes data into the first drive circuit, and the first compensating circuit compensates the first drive circuit; at this point, the fourth transistor T4 and the ninth transistor T9 are switched on, but no electrical current path is formed; the second data signal Vdata2 outputted by the second data signal end Data2 is transmitted to the second node N2 through the fifteenth transistor T15 and the sixteenth transistor T16; after the second storage capacitor C2 is charged, the voltage of the second node N2 is Vdata2+Vth2 (Vth2 is the overall pressure drop of the fifteenth transistor T15 and the sixteenth transistor T16), that is, the second data write circuit writes data into the second drive circuit, and the second compensating circuit compensates the second drive circuit; and at this point, the tenth transistor T10 and the seventeenth transistor T17 are switched on, but no electrical current path is formed.

For instance, in the initialization period t4, the first control end Sn−1 outputs a high level signal; the second control end Sn outputs a high level signal; the third control end Sn+1 outputs a low level signal; the fourth control end En outputs a high level signal; the first data signal end Data1 outputs a high level signal; and the second data signal end Data2 outputs a high level signal.

Figure 6D:
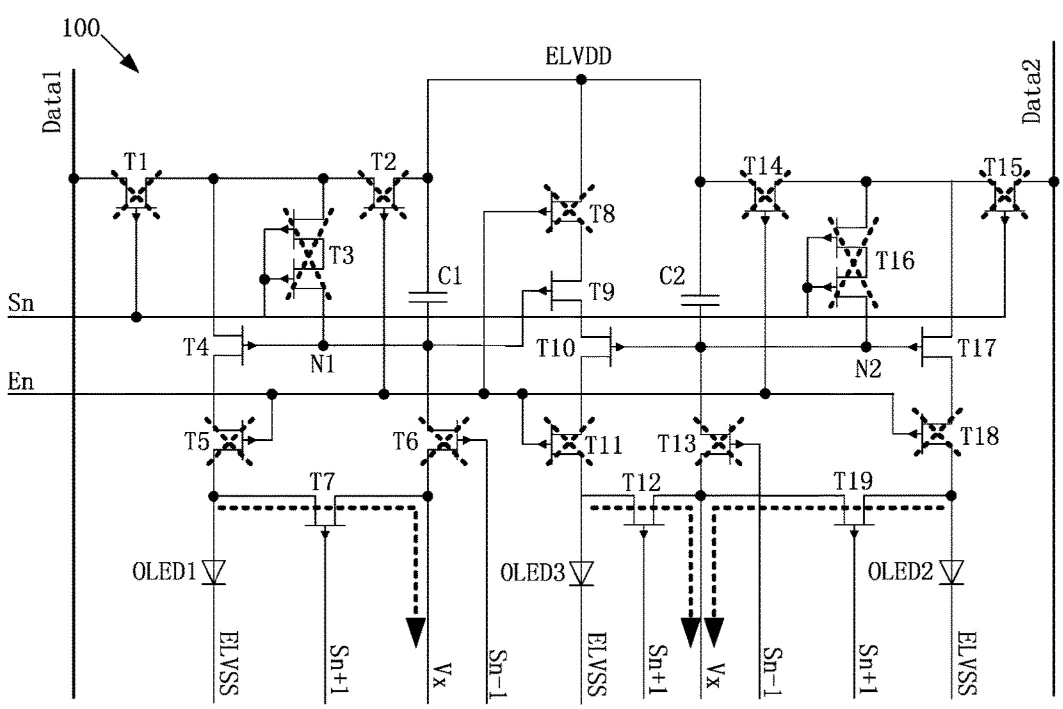
FIG. 6D is a schematic diagram illustrating the conduction state in the initialization period when the pixel circuit as illustrated in FIG. 2 provided by an embodiment of the present disclosure is driven by the drive timing as illustrated in FIG. 5.

FIG. 6D is a schematic diagram illustrating the conduction state in the initialization period when the pixel circuit as illustrated in FIG. 2 provided by an embodiment of the present disclosure is driven by the drive timing as illustrated in FIG. 5. In the initialization period t4, the first transistor T1, the second transistor T2, the third transistor T3, the fifth transistor T5, the sixth transistor T6, the eighth transistor T8, the tenth transistor T10, the eleventh transistor T11, the thirteenth transistor T13, the fourteenth transistor T14, the fifteenth transistor T15, the sixteenth transistor T16, the seventeenth transistor T17 and the eighteenth transistor T18 are all in the off-states. Because of the voltage storage function of the first storage capacitor C1, the fourth transistor T4 and the ninth transistor T9 are kept in the on-state the same as that in the compensation period t3. Because of the voltage storage function of the second storage capacitor C2, the tenth transistor T10 and the seventeenth transistor T17 are kept in the on-state the same as that in the compensation period t3. As the third control end Sn+1 outputs the low level signal, the seventh transistor T7, the twelfth transistor T12 and the nineteenth transistor T19 are switched on; the reset voltage Vvx provided by the third power end Vx is transmitted to a first electrode (the first electrode is, for instance, an anode) of the first organic light-emitting diode OLED1 through the seventh transistor T7; the reset voltage Vvx provided by the third power end Vx is transmitted to a first electrode (the first electrode is, for instance, an anode) of the third organic light-emitting diode OLED3 through the twelfth transistor T12; and the reset voltage Vvx provided by the third power end Vx is transmitted to a first electrode (the first electrode is, for instance, an anode) of the second organic light-emitting diode OLED2 through the nineteenth transistor T19. That is to say, the first initializing circuit initializes the first light-emitting circuit; the second initializing circuit initializes the second light-emitting circuit; and the third initializing circuit initializes the third light-emitting circuit. For instance, the reset voltage Vvx is less than or equal to the second luminous voltage Velvss provided by the second power end ELVSS. Thus, the abnormal emission of the OLED can be prevented by initialization, and for instance, the slightly bright emission of the OLED in the non-luminous period can be avoided.

For instance, in the pre-emission period t5, the first control end Sn−1 outputs a high level signal; the second control end Sn outputs a high level signal; the third control end Sn+1 outputs a high level signal; the fourth control end En outputs a high level signal; the first data signal end Data1 outputs a high level signal; and the second data signal end Data2 outputs a high level signal.

Figure 6E:
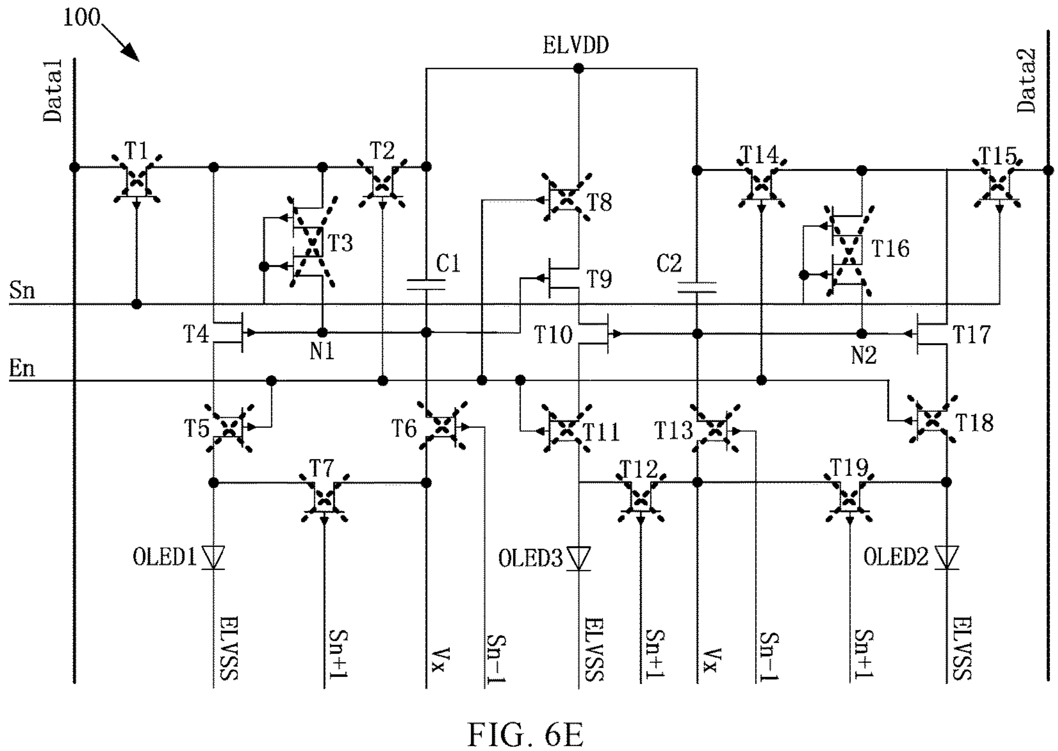
FIG. 6E is a schematic diagram illustrating the conduction state in the pre-emission period when the pixel circuit as illustrated in FIG. 2 provided by an embodiment of the present disclosure is driven by the drive timing as illustrated in FIG. 5.

FIG. 6E is a schematic diagram illustrating the conduction state in the pre-emission period when the pixel circuit as illustrated in FIG. 2 provided by an embodiment of the present disclosure is driven by the drive timing as illustrated in FIG. 5. In the pre-emission period t5, the first transistor T1, the second transistor T2, the third transistor T3, the fifth transistor T5, the sixth transistor T6, the seventh transistor T7, the eighth transistor T8, the eleventh transistor T11, the twelfth transistor T12, the thirteenth transistor T13, the fourteenth transistor T14, the fifteenth transistor T15, the sixteenth transistor T16, the eighteenth transistor T18, and the nineteenth transistor T19 are all in the off-states, and no electrical current path is formed in the pixel circuit. Because of the voltage storage function of the first storage capacitor C1, the fourth transistor T4 and the ninth transistor T9 are kept in the on-state the same as that in the initialization period t4. Because of the voltage storage function of the second storage capacitor C2, the tenth transistor T10 and the seventeenth transistor T17 are kept in the on-state the same as that in the compensation period t4. For instance, the pre-emission period can provide a stable time period for the pixel circuit, so that the voltage and the current of various circuit elements can be kept in a stable state, and hence the circuit abnormality can be avoided.

For instance, in the emission period t6, the first control end Sn−1 outputs a high level signal; the second control end Sn outputs a high level signal; the third control end Sn+1 outputs a high level signal; the fourth control end En outputs a low level signal; the first data signal end Data1 outputs a high level signal; and the second data signal end Data2 outputs a high level signal.

Figure 6F:
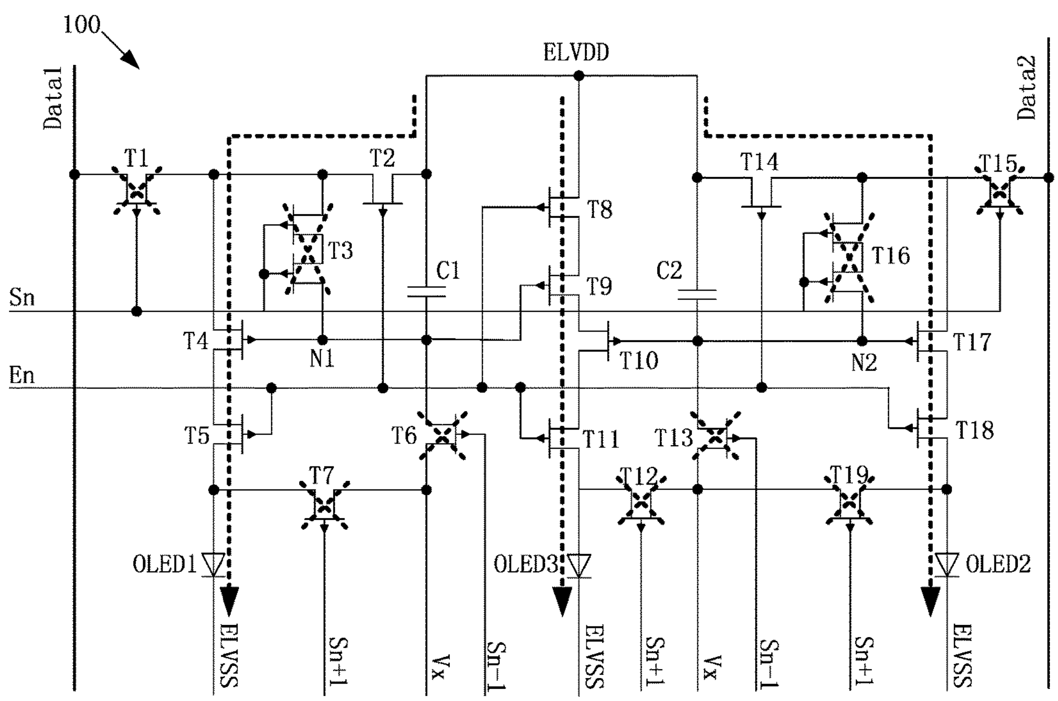
FIG. 6F is a schematic diagram illustrating the conduction state in the emission period when the pixel circuit as illustrated in FIG. 2 provided by an embodiment of the present disclosure is driven by the drive timing as illustrated in FIG. 5.

FIG. 6F is a schematic diagram illustrating the conduction state in the emission period when the pixel circuit as illustrated in FIG. 2 provided by an embodiment of the present disclosure is driven by the drive timing as illustrated in FIG. 5. In the emission period t6, the first transistor T1, the third transistor T3, the sixth transistor T6, the seventh transistor T7, the twelfth transistor T12, the thirteenth transistor T13, the fifteenth transistor T15, the sixteenth transistor T16, and the nineteenth transistor T19 are all in the off-states. Because of the voltage storage function of the first storage capacitor C1, the fourth transistor T4 and the ninth transistor T9 are kept in the on-state the same as that in the pre-emission period t5. Because of the voltage storage function of the second storage capacitor C2, the tenth transistor T10 and the seventeenth transistor T17 are kept in the on-state the same as that in the compensation period t5. As the fourth control end En outputs the low level signal, the second transistor T2, the fifth transistor T5, the eighth transistor T8, the eleventh transistor T11, the fourteenth transistor T14 and the eighteenth transistor T18 are in the on-states. An electrical current path is formed by the first power end ELVDD, the second transistor T2, the fourth transistor T4, the fifth transistor T5, the first organic light-emitting diode OLED1 and the second power end ELVSS; an electrical current path is formed by the first power end ELVDD, the eighth transistor T8, the ninth transistor T9, the tenth transistor T10, the eleventh transistor T11, the third organic light-emitting diode OLED3 and the second power end ELVSS; and an electrical current path is formed by the first power end ELVDD, the fourteenth transistor T14, the seventeenth transistor T17, the eighteenth transistor T18, the second organic light-emitting diode OLED2 and the second power end ELVSS. The first organic light-emitting diode OLED1 is driven by the fourth transistor T4 to emit light under the action of the first luminous voltage Velvdd provided by the first power end ELVDD and the second luminous voltage Velvss provided by the second power end ELVSS; the second organic light-emitting diode OLED2 is driven by the seventeenth transistor T17 to emit light under the action of the first luminous voltage Velvdd provided by the first power end ELVDD and the second luminous voltage Velvss provided by the second power end ELVSS; and the third organic light-emitting diode OLED3 is driven by the ninth transistor T9 and the tenth transistor T10 to emit light under the action of the first luminous voltage Velvdd provided by the first power end ELVDD and the second luminous voltage Velvss provided by the second power end ELVSS. That is to say, the first light-emitting control circuit controls the operation of the first light-emitting circuit; the second light-emitting control circuit controls the operation of the second light-emitting circuit; the third light-emitting control circuit controls the operation of the third light-emitting circuit; the first power end provides the first luminous voltage for the first light-emitting circuit, the second light-emitting circuit and the third light-emitting circuit; the second power end provides the second luminous voltage for the first light-emitting circuit, the second light-emitting circuit and the third light-emitting circuit; the first drive circuit drives the first light-emitting circuit; the second drive circuit drives the second light-emitting circuit; the third drive circuit drives the third light-emitting circuit; and the first light-emitting circuit, the second light-emitting circuit and the third light-emitting circuit emit light in the working process.

Figure 7:
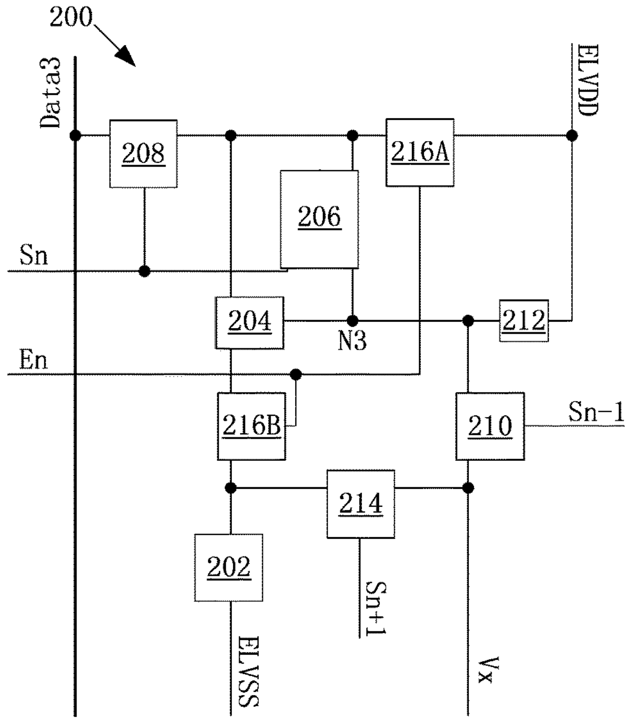
FIG. 7 is a first schematic diagram of still another pixel circuit provided by an embodiment of the present disclosure.

For instance, FIG. 7 is a first schematic diagram of still another pixel circuit provided by an embodiment of the present disclosure. As illustrated in FIG. 7, the embodiment of the present disclosure further provides a pixel circuit 200, which comprises: a fourth light-emitting circuit 202 configured to emit light in the working process; a fourth drive circuit 204 configured to drive the fourth light-emitting circuit 202; a third compensating circuit 206 configured to compensate the fourth drive circuit 204; a third data write circuit 208 configured to write data into the fourth drive circuit 204; a third reset circuit 210 configured to reset the fourth drive circuit 204; a third storage circuit 212 configured to store the driving voltage of the fourth drive circuit 204; a fourth initializing circuit 214 configured to initialize the fourth light-emitting circuit 202; a fourth light-emitting control circuit 216 configured to control the ON and OFF operations of the fourth light-emitting circuit 202; a first power end ELVDD configured to provide a first luminous voltage Velvdd for the fourth light-emitting circuit 202; a second power end ELVSS configured to provide a second luminous voltage Velvss for the fourth light-emitting circuit 202; a third power end Vx configured to provide a reset voltage Vvx for the third reset circuit 210; a third data signal end Data3 configured to provide a third data signal or a standby signal for the third data write circuit 208; a first control end Sn−1 configured to provide a first control signal for controlling the ON and OFF operations of the third reset circuit 210; a second control end Sn configured to provide a second control signal for controlling the ON and OFF operations of the third data write circuit 208 and the third compensating circuit 206; a third control end Sn+1 configured to provide a third control signal for controlling the ON and OFF operations of the fourth initializing circuit 214; and a fourth control end En configured to provide a fourth control signal for controlling the ON and OFF operations of the fourth light-emitting control circuit 216.

Figure 8:
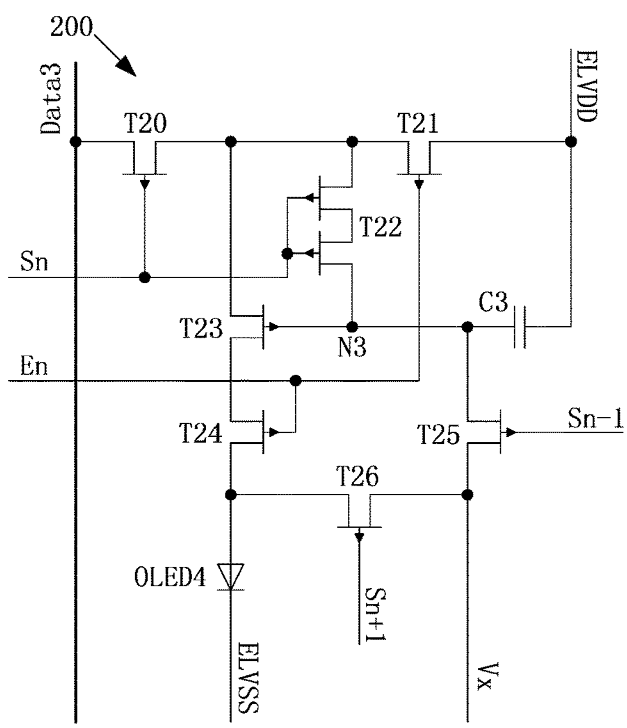
FIG. 8 is a second schematic diagram of still another pixel circuit provided by an embodiment of the present disclosure.

For instance, FIG. 8 is a second schematic diagram of still another pixel circuit provided by an embodiment of the present disclosure. FIG. 8 is a preferred embodiment of the pixel circuit as illustrated in FIG. 7. As illustrated in FIGS. 7 and 8, in the pixel circuit 200 provided by an embodiment of the present disclosure, the third data write circuit 208 includes a twentieth transistor T20; the fourth light-emitting control circuit 216 includes a twenty-first transistor T21 and a twenty-fourth transistor T24; the third compensating circuit 206 includes a twenty-second transistor T22; the fourth drive circuit 204 includes a twenty-third transistor T23; the third reset circuit 210 includes a twenty-fifth transistor T25; the fourth initializing circuit 214 includes a twenty-sixth transistor T26; the third storage circuit 212 includes a third storage capacitor C3; and the fourth light-emitting circuit 202 includes a fourth organic light-emitting diode OLED4.

For instance, as illustrated in FIG. 8, the twenty-second transistor T22 includes a fifth sub-transistor and a sixth sub-transistor; a source electrode of the fifth sub-transistor is taken as a source electrode of the twenty-second transistor T22; a drain electrode of the fifth sub-transistor is electrically connected with a source electrode of the sixth sub-transistor; a drain electrode of the sixth sub-transistor is taken as a drain electrode of the twenty-second transistor T22; and a gate electrode of the fifth sub-transistor and a gate electrode of the sixth sub-transistor are electrically connected with each other to act as a gate electrode of the twenty-second transistor T22 together. It should be noted that the embodiment of the present disclosure includes but not limited to the configuration of the twenty-second transistor, and the twenty-second transistor T22 may also include one transistor only.

For instance, as illustrated in FIG. 8, in the pixel circuit 200 provided by an embodiment of the present disclosure, a source electrode of the twentieth transistor T20 is electrically connected with the third data signal end Data3; a gate electrode of the twentieth transistor T20 and a gate electrode of the twenty-second transistor T22 are electrically connected with the second control end Sn; a drain electrode of the twentieth transistor T20, a drain electrode of the twenty-first transistor T21, a source electrode of the twenty-second transistor T22, and a source electrode of the twenty-third transistor T23 are electrically connected with each other; a gate electrode of the twenty-first transistor T21 and a gate electrode of the twenty-fourth transistor T24 are electrically connected with the fourth control end En; a source electrode of the twenty-first transistor T21 and a first end of the third storage capacitor C3 are electrically connected with the first power end ELVDD; a drain electrode of the twenty-second transistor T22 is electrically connected with a third node N3; a gate electrode of the twenty-third transistor T23 is electrically connected with the third node N3; a drain electrode of the twenty-third transistor T23 is electrically connected with a source electrode of the twenty-fourth transistor T24; a drain electrode of the twenty-fourth transistor T24 and a drain electrode of the twenty-sixth transistor T26 are electrically connected with a first end of the fourth organic light-emitting diode OLED4; a source electrode of the twenty-fifth transistor T25 and a source electrode of the twenty-sixth transistor T26 are electrically connected with the third power end Vx; a gate electrode of the twenty-fifth transistor T25 is electrically connected with the first control end Sn−1; a drain electrode of the twenty-fifth transistor T25 is electrically connected with the third node N3; a gate electrode of the twenty-sixth transistor T26 is electrically connected with the third control end Sn+1; a second end of the third storage capacitor C3 is electrically connected with the third node N3; and a second end of the fourth organic light-emitting diode OLED4 is electrically connected with the second power end ELVSS.

For instance, in the pixel circuit provided by an embodiment of the present disclosure, the twentieth transistor T20, the twenty-first transistor T21, the twenty-second transistor T22, the twenty-third transistor T23, the twenty-fourth transistor T24, the twenty-fifth transistor T25 and the twenty-sixth transistor T26 are all TFTs.

For instance, in the pixel circuit provided by an embodiment of the present disclosure, the twentieth transistor T20, the twenty-first transistor T21, the twenty-second transistor T22, the twenty-third transistor T23, the twenty-fourth transistor T24, the twenty-fifth transistor T25 and the twenty-sixth transistor T26 are all P-type transistors.

Figure 9:
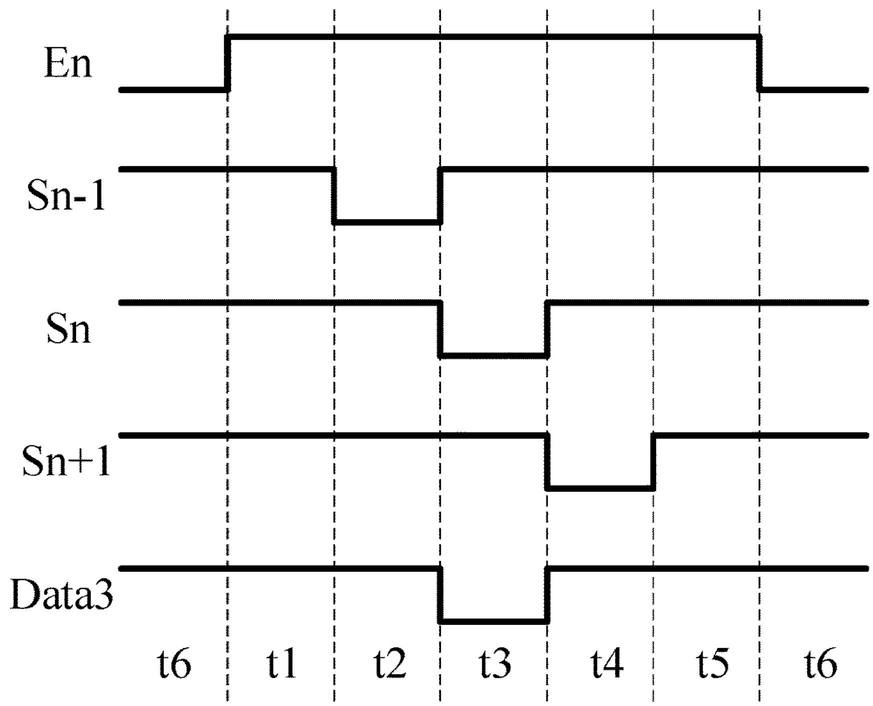
FIG. 9 is a drive timing diagram of the pixel circuit as illustrated in FIG. 8 provided by an embodiment of the present disclosure.

For instance, FIG. 9 is a drive timing diagram of the pixel circuit as illustrated in FIG. 8 provided by an embodiment of the present disclosure. The embodiment of the present disclosure further provides a driving method of the pixel circuit as illustrated in FIG. 8, which comprises: a pre-reset period t1, a reset period 52, a compensation period t3, an initialization period t4, a pre-emission period t5, and an emission period t6.

For instance, in the pre-reset period t1, the first control end Sn−1 outputs a high level signal; the second control end Sn outputs a high level signal; the third control end Sn+1 outputs a high level signal; the fourth control end En outputs a high level signal; and the third data signal end Data3 outputs a high level signal.

Figure 10A:
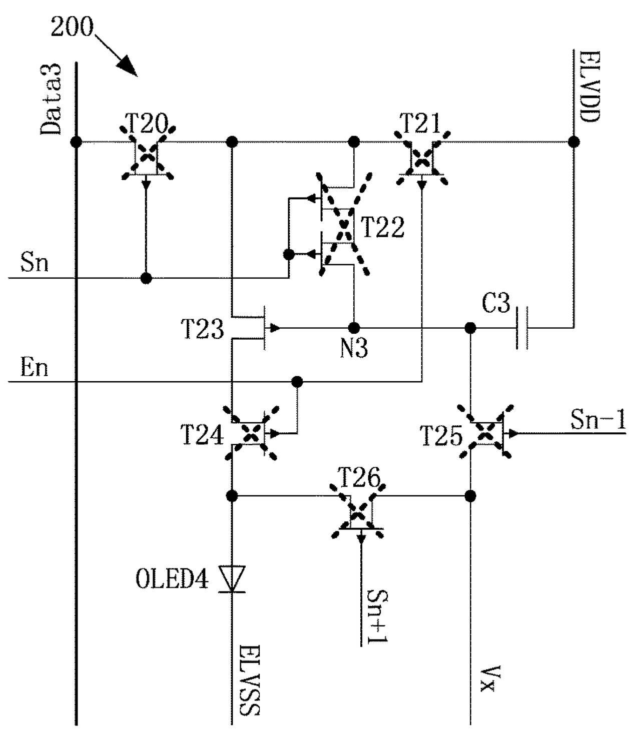
FIG. 10A is a schematic diagram illustrating the conduction state in the pre-reset period when the pixel circuit as illustrated in FIG. 8 provided by an embodiment of the present disclosure is driven by the drive timing as illustrated in FIG. 9.

For instance, FIG. 10A is a schematic diagram illustrating the conduction state in the pre-reset period t1 when the pixel circuit as illustrated in FIG. 8 provided by an embodiment of the present disclosure is driven by the drive timing as illustrated in FIG. 9. In the pre-reset period t1, the twentieth transistor T20, the twenty-first transistor T21, the twenty-second transistor T22, the twenty-fourth transistor T24, the twenty-fifth transistor T25 and the twenty-sixth transistor T26 are all in the off-states, and no electrical current path is formed in the pixel circuit; and the conduction state of the twenty-third transistor T23 is relevant to the voltage of the third node N3. For instance, the pre-reset period can provide a stable time period for the pixel circuit, so that the voltage and the current of various circuit elements can be kept in a stable state, and hence the circuit abnormality can be avoided.

For instance, in the reset period t2, the first control end Sn−1 outputs a low level signal; the second control end Sn outputs a high level signal; the third control end Sn+1 outputs a high level signal; the fourth control end En outputs a high level signal; and the third data signal end Data3 outputs a high level signal.

Figure 10B:
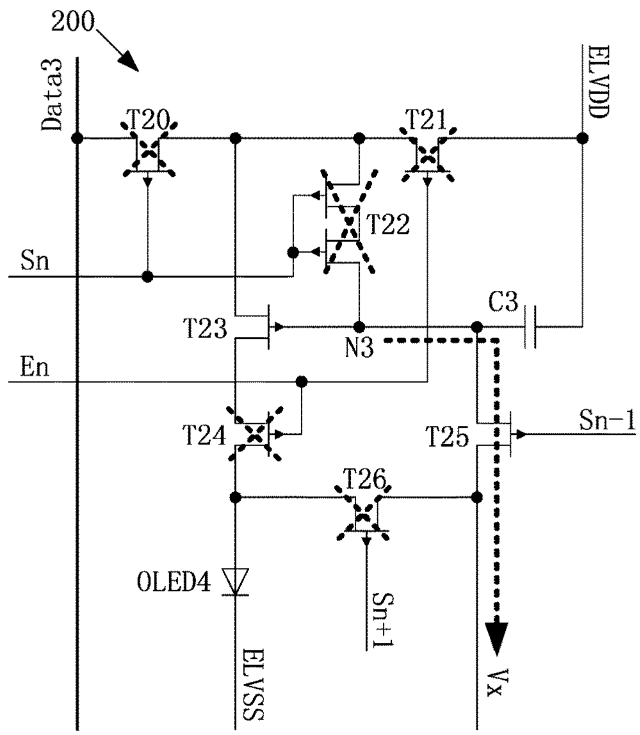
FIG. 10B is a schematic diagram illustrating the conduction state in the reset period when the pixel circuit as illustrated in FIG. 8 provided by an embodiment of the present disclosure is driven by the drive timing as illustrated in FIG. 9.

FIG. 10B is a schematic diagram illustrating the conduction state in the reset period t2 when the pixel circuit as illustrated in FIG. 8 provided by an embodiment of the present disclosure is driven by the drive timing as illustrated in FIG. 9. In the reset period t2, the twentieth transistor T20, the twenty-first transistor T21, the twenty-second transistor T22, the twenty-fourth transistor T24 and the twenty-sixth transistor T26 are all in the off-states. As the first control end Sn−1 outputs the low level signal, the twenty-fifth transistor T25 is switched on; the voltage of the third node N3 is the reset voltage Vvx provided by the third power end Vx; the reset voltage Vvx is, for instance, a low level voltage capable of switching on the P-type transistor, or for instance, the reset voltage Vvx is a negative voltage; and at this point, as the voltage of the third node N3 is the low-level reset voltage Vvx, the twenty-third transistor T23 is switched on, but no electrical current path is formed. Thus, the twenty-third transistor T23 is reset through the twenty-fifth transistor T25, namely the third reset circuit resets the fourth drive circuit. For instance, the voltage difference between the third node N3 and the third data signal Vdata3 can be increased after the reset period, so that the charging time of the third storage capacitor C3 can be reduced in the compensation period t3.

For instance, in the compensation period t3, the first control end Sn−1 outputs a high level signal; the second control end Sn outputs a low level signal; the third control end Sn+1 outputs a high level signal; the fourth control end En outputs a high level signal; and the third data signal end Data3 outputs a third data signal Vdata3 (e.g., a low level signal).

Figure 10C:
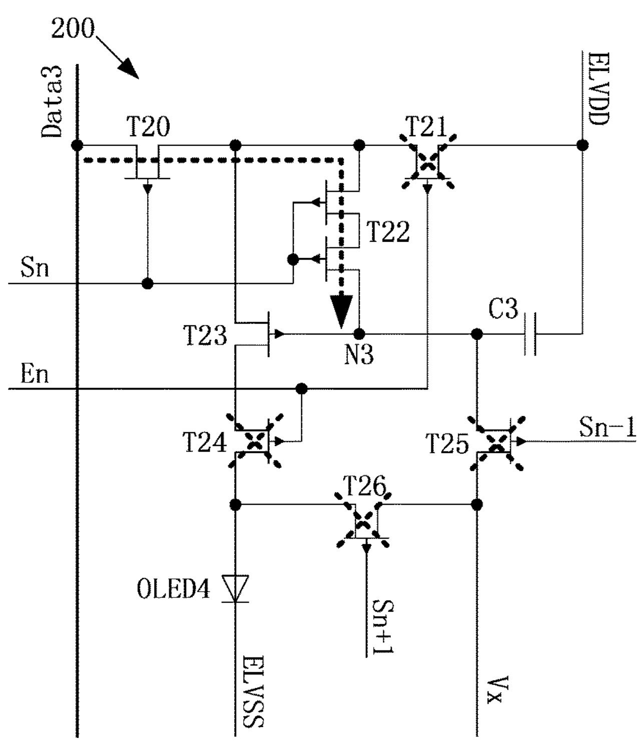
FIG. 10C is a schematic diagram illustrating the conduction state in the compensation period when the pixel circuit as illustrated in FIG. 8 provided by an embodiment of the present disclosure is driven by the drive timing as illustrated in FIG. 9.

FIG. 10C is a schematic diagram illustrating the conduction state in the compensation period t3 when the pixel circuit as illustrated in FIG. 8 provided by an embodiment is driven by the drive timing as illustrated in FIG. 9. In the compensation period t3, the twenty-first transistor T21, the twenty-fourth transistor T24, the twenty-fifth transistor T25 and the twenty-sixth transistor T26 are all in the off-states. As the second control end Sn outputs the low level signal, the twentieth transistor T20 and the twenty-second transistor T22 are switched on; the third data signal Vdata3 outputted by the third data signal end Data3 is transmitted to the third node N3 through the twentieth transistor T20 and the twenty-second transistor T22; after the third storage capacitor C3 is charged, the voltage of the third node N3 is Vdata3+Vth3 (Vth3 is the overall pressure drop of the twentieth transistor T20 and the twenty-second transistor T22), that is, the third data write circuit writes data into the fourth drive circuit, and the third compensating circuit compensates the fourth drive circuit; and at this point, the twenty-third transistor T23 is switched on, but no electrical current path is formed.

For instance, in the initialization period t4, the first control end Sn−1 outputs a high level signal; the second control end Sn outputs a high level signal; the third control end Sn+1 outputs a low level signal; the fourth control end En outputs a high level signal; and the third data signal end Data3 outputs a high level signal.

Figure 10D:
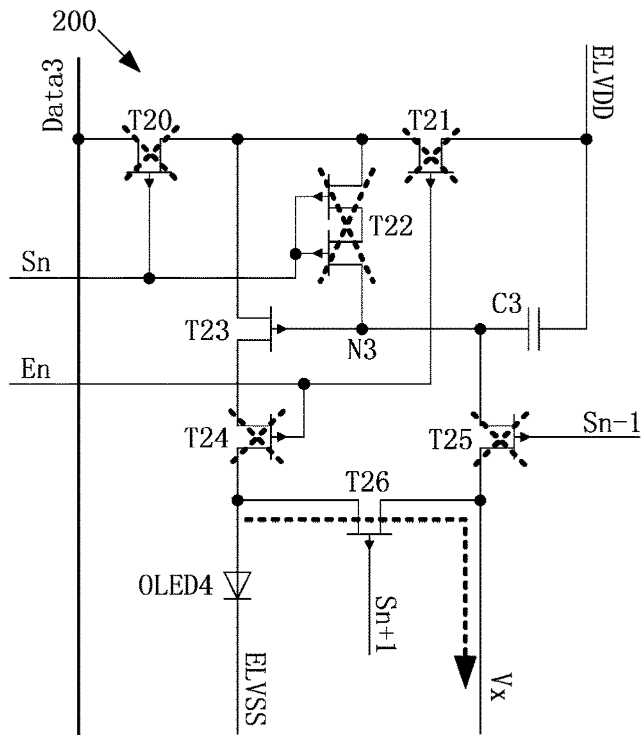
FIG. 10D is a schematic diagram illustrating the conduction state in the initialization period when the pixel circuit as illustrated in FIG. 8 provided by an embodiment of the present disclosure is driven by the drive timing as illustrated in FIG. 9.

FIG. 10D is a schematic diagram illustrating the conduction state in the initialization period t4 when the pixel circuit as illustrated in FIG. 8 provided by an embodiment of the present disclosure is driven by the drive timing as illustrated in FIG. 9. In the initialization period t4, the twentieth transistor T20, the twenty-first transistor T21, the twenty-second transistor T22, the twenty-fourth transistor T24 and the twenty-fifth transistor T25 are all in the off-states. Because of the voltage storage function of the third storage capacitor C3, the twenty-third transistor T23 is kept in the on-state the same as that in the compensation period t3. As the third control end Sn+1 outputs the low level signal, the twenty-sixth transistor T26 is switched on; and the reset voltage Vvx provided by the third power end Vx is transmitted to a first electrode (the first electrode is, for instance, an anode) of the fourth organic light-emitting diode OLED4 through the twenty-sixth transistor T26, namely the fourth initializing circuit initializes the fourth light-emitting circuit. For instance, the reset voltage Vvx is less than or equal to the second luminous voltage Velvss provided by the second power end ELVSS. Thus, the abnormal emission of the OLED can be prevented by initialization, for instance, the slightly bright emission of the OLED in the non-luminous period can be avoided. For instance, the present disclosure performs initialization discharge on the OLEDs, ensures the accuracy under a low gray scale and full black under a full dark frame, and effectively improves the contrast of the entire display panel.

For instance, in the pre-emission period t5, the first control end Sn−1 outputs a high level signal; the second control end Sn outputs a high level signal; the third control end Sn+1 outputs a high level signal; the fourth control end En outputs a high level signal; and the third data signal end Data3 outputs a high level signal.

Figure 10E:
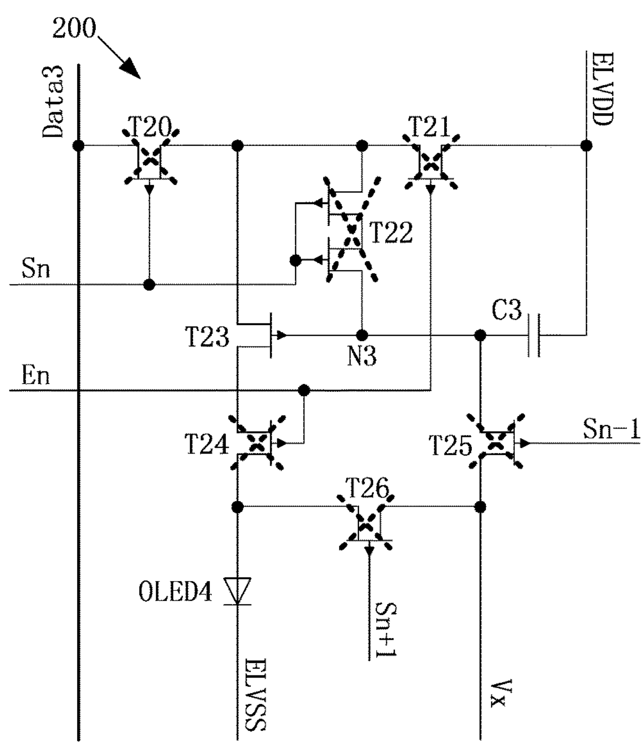
FIG. 10E is a schematic diagram illustrating the conduction state in the pre-emission period when the pixel circuit as illustrated in FIG. 8 provided by an embodiment of the present disclosure is driven by the drive timing as illustrated in FIG. 9.

FIG. 10E is a schematic diagram illustrating the conduction state in the pre-emission period t5 when the pixel circuit as illustrated in FIG. 8 provided by an embodiment of the present disclosure is driven by the drive timing as illustrated in FIG. 9. In the pre-emission period t5, the twentieth transistor T20, the twenty-first transistor T21, the twenty-second transistor T22, the twenty-fourth transistor T24, the twenty-fifth transistor T25 and the twenty-sixth transistor T26 are all in the off-states, and no electrical current path is formed in the pixel circuit. Because of the voltage storage function of the third storage capacitor C3, the twenty-third transistor T23 is kept in the on-state the same as that in the initialization period t4. For instance, the pre-emission period can provide a stable time period for the pixel circuit, so that the voltage and the current of various circuit elements can be kept in a stable state, and hence the circuit abnormality can be avoided.

For instance, in the emission period t6, the first control end Sn−1 outputs a high level signal; the second control end Sn outputs a high level signal; the third control end Sn+1 outputs a high level signal; the fourth control end En outputs a low level signal; and the third data signal end Data3 outputs a high level signal.

Figure 10F:
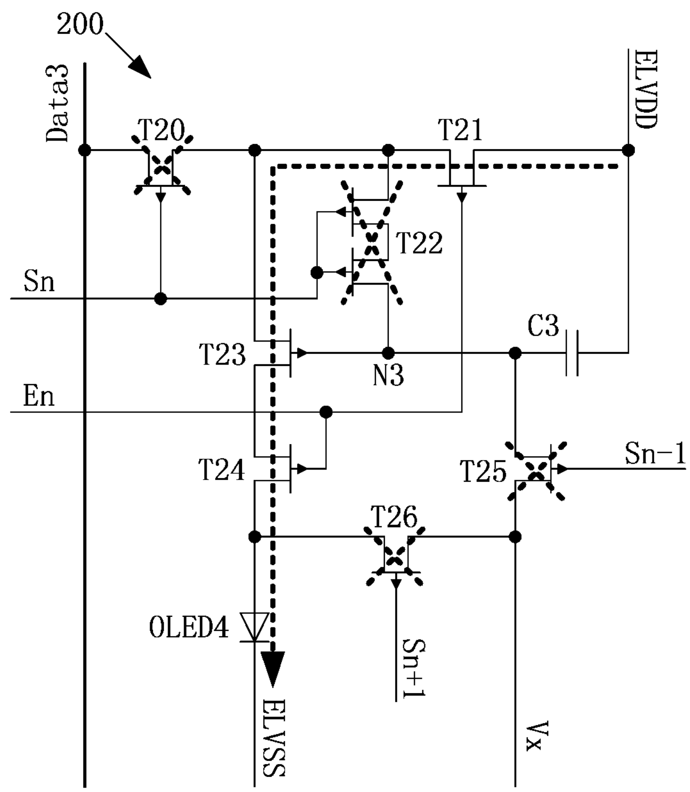
FIG. 10F is a schematic diagram illustrating the conduction state in the emission period when the pixel circuit as illustrated in FIG. 8 provided by an embodiment of the present disclosure is driven by the drive timing as illustrated in FIG. 9.

FIG. 10F is a schematic diagram illustrating the conduction state when the pixel circuit as illustrated in FIG. 8 provided by an embodiment of the present disclosure is driven by the drive timing as illustrated in FIG. 9. In the emission period t6, the twentieth transistor T20, the twenty-second transistor T22, the twenty-fifth transistor T25 and the twenty-sixth transistor T26 are all in the off-states. Because of the voltage storage function of the third storage capacitor C3, the twenty-third transistor T23 is kept in the on-state the same as that in the pre-emission period t5. As the fourth control end En outputs the low level signal, the twenty-first transistor T21 and the twenty-fourth transistor T24 are in the on-state; an electrical current path is formed by the first power end ELVDD, the twenty-first transistor T21, the twenty-third transistor T23, the twenty-fourth transistor T24, the fourth organic light-emitting diode OLED4 and the second power end ELVSS; and the fourth organic light-emitting diode OLED4 is driven by the twenty-third transistor T23 to emit light under the action of the first luminous voltage Velvdd provided by the first power end ELVDD and the second luminous voltage Velvss provided by the second power end ELVSS. That is to say, the fourth light-emitting control circuit controls the operation of the fourth light-emitting circuit; the first power end provides the first luminous voltage for the fourth light-emitting circuit; the second power end provides the second luminous voltage for the fourth light-emitting circuit; the fourth drive circuit drives the fourth light-emitting circuit; and the fourth light-emitting circuit emits light in the working process.

It should be noted that the driving method of the pixel circuit as illustrated in FIG. 8 may only comprise the reset period t2, the compensation period t3, the initialization period t4 and the emission period t6 and does not comprise the pre-reset period t1 and the pre-emission period t5, or comprises one of the pre-reset period t1 and the pre-emission period t5. No limitation will be given here.

Figure 11:
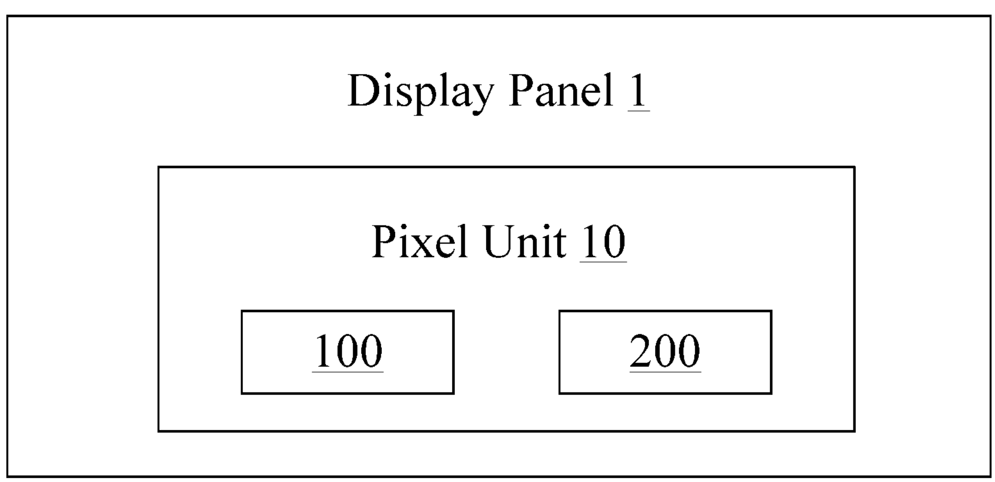
FIG. 11 is a schematic diagram of a display panel provided by an embodiment of the present disclosure.

For instance, as illustrated in FIG. 11, an embodiment of the present disclosure provides a display panel 1, which comprises the pixel circuit provided by any embodiment of the present disclosure.

For instance, the display panel 1 comprises a plurality of pixel units 10; and each pixel unit 10 includes the pixel circuit 100 provided by an embodiment of the present disclosure and the pixel circuit 200 provided by an embodiment of the present disclosure. That is to say, the display panel 1 provided by an embodiment of the present disclosure comprises the pixel circuit including the first organic light-emitting diode OLED1, the second organic light-emitting diode OLED2 and the third organic light-emitting diode OLED3 and the pixel circuit including the fourth organic light-emitting diode OLED4.

For instance, in the display panel 1 provided by an embodiment of the present disclosure, the first organic light-emitting diode OLED1 emits red light in the working process; the second organic light-emitting diode OLED2 emits green light in the working process; the third organic light-emitting diode OLED3 emits yellow light in the working process; and the fourth organic light-emitting diode OLED4 emits blue light in the working process.

For instance, the display panel provided by an embodiment of the present disclosure may be applied to any product or component with display function such as a mobile phone, a tablet PC, a TV set, a display, a notebook computer, a digital picture frame and a navigator.

For instance, in the display panel 1 provided by an embodiment of the present disclosure, the pixel circuit 100 simultaneously controls the first organic light-emitting diode OLED1, the second organic light-emitting diode OLED2 and the third organic light-emitting diode OLED3, reduces the number of the pixel circuits on the whole, reduces the area occupied by the pixel circuit, and improves the resolution of the display panel.

An embodiment of the present disclosure further provides a driving method, which comprises: a reset period, a compensation period, an initialization period and an emission period. In the reset period, the first control end Sn−1 outputs a valid signal; the second control end Sn outputs an invalid signal; the third control end Sn+1 outputs an invalid signal; the fourth control end En outputs an invalid signal; the first data signal end Data1 outputs a standby signal; the second data signal end Data2 outputs a standby signal; and the third data signal end Data3 outputs a standby signal. In the compensation period, the first control end Sn−1 outputs an invalid signal; the second control end Sn outputs a valid signal; the third control end Sn+1 outputs an invalid signal; the fourth control end En outputs an invalid signal; the first data signal end Data1 outputs a first data signal, the second data signal end Data2 outputting a standby signal, the third data signal end Data3 outputting a third data signal or a standby signal; alternatively, the first data signal end Data1 outputs a standby signal, the second data signal end Data2 outputting a second data signal, the third data signal end Data3 outputting the third data signal or the standby signal; alternatively, the first data signal end Data1 outputs the first data signal, the second data signal end Data2 outputting the second data signal, the third data signal end Data3 outputting the third data signal or the standby signal. In the initialization period, the first control end Sn−1 outputs an invalid signal; the second control end Sn outputs an invalid signal; the third control end Sn+1 outputs a valid signal; the fourth control end En outputs an invalid signal; the first data signal end Data1 outputs a standby signal; the second data signal end Data2 outputs a standby signal; and the third data signal end Data3 outputs a standby signal. In the emission period, the first control end Sn−1 outputs an invalid signal; the second control end Sn outputs an invalid signal; the third control end Sn+1 outputs an invalid signal; the fourth control end En outputs a valid signal; the first data signal end Data1 outputs a standby signal; the second data signal end Data2 outputs a standby signal; and the third data signal end Data3 outputs a standby signal.

For instance, the driving method provided by an embodiment of the present disclosure is used for driving the display panel 1.

Figure 12:
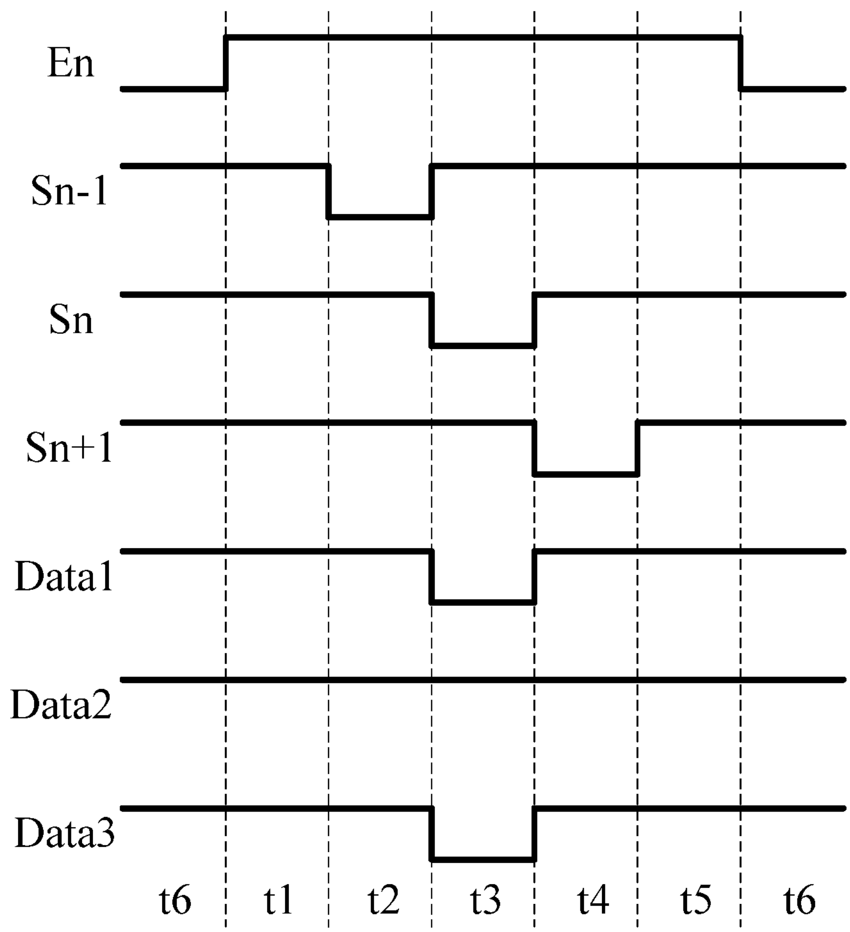
FIG. 12 is a schematic diagram illustrating the drive timing in a driving method provided by an embodiment of the present disclosure when a first OLED, a fourth OLED emit light and a second OLED and a third OLED are switched off.

For instance, description is given here by taking the case that the first organic light-emitting diode OLED1, the fourth organic light-emitting diode OLED4, the second organic light-emitting diode OLED2 and the third organic light-emitting diode OLED3 in the display panel 1 are switched off as an example. As illustrated in FIG. 12, the embodiment of the present disclosure provides a driving method, which comprises: a pre-reset period t1, a reset period t2, a compensation period t3, an initialization period t4, a pre-emission period t5, and an emission period t6.

For instance, in the pre-reset period t1, the first control end Sn−1 outputs a high level signal; the second control end Sn outputs a high level signal; the third control end Sn+1 outputs a high level signal; the fourth control end En outputs a high level signal; the first data signal end Data1 outputs a high level signal; the second data signal end Data2 outputs a high level signal; and the third data signal end Data3 outputs a high level signal.

For instance, in the reset period t2, the first control end Sn−1 outputs a low level signal; the second control end Sn outputs a high level signal; the third control end Sn+1 outputs a high level signal; the fourth control end En outputs a high level signal; the first data signal end Data1 outputs a high level signal; the second data signal end Data2 outputs a high level signal; and the third data signal end Data3 outputs a high level signal.

For instance, in the compensation period t3, the first control end Sn−1 outputs a high level signal; the second control end Sn outputs a low level signal; the third control end Sn+1 outputs a high level signal; the fourth control end En outputs a high level signal; the first data signal end Data1 outputs a first data signal; the second data signal end Data2 outputs a high level signal; and the third data signal end Data3 outputs a third data signal.

For instance, in the initialization period t4, the first control end Sn−1 outputs a high level signal; the second control end Sn outputs a high level signal; the third control end Sn+1 outputs a low level signal; the fourth control end En outputs a high level signal; the first data signal end Data1 outputs a high level signal; the second data signal end Data2 outputs a high level signal; and the third data signal end Data3 outputs a high level signal.

For instance, in the pre-emission period t5, the first control end Sn−1 outputs a high level signal; the second control end Sn outputs a high level signal; the third control end Sn+1 outputs a high level signal; the fourth control end En outputs a high level signal; the first data signal end Data1 outputs a first data signal; the second data signal end Data2 outputs a high level signal; and the third data signal end Data3 outputs a third data signal.

For instance, in the emission period t6, the first control end Sn−1 outputs a high level signal; the second control end Sn outputs a high level signal; the third control end Sn+1 outputs a high level signal; the fourth control end En outputs a low level signal; the first data signal end Data1 outputs a high level signal; the second data signal end Data2 outputs a high level signal; and the third data signal end Data3 outputs a high level signal.

For instance, when the light-emitting states of the first organic light-emitting diode OLED1, the second organic light-emitting diode OLED2, the third organic light-emitting diode OLED3, and the fourth organic light-emitting diode OLED4 adopt other combinations, the drive timing may be correspondingly converted. No further description will be given here.

For instance, the display panel and the driving method, provided by an embodiment of the present disclosure, can perform initialization discharge on the OLEDs, ensure the accuracy under a low gray scale and full black under a full dark frame, and effectively improve the contrast of the entire display panel.

For instance, according to different display frames, the brightness of the third organic light-emitting diode OLED3 may be adopted to replace the combined brightness of the first organic light-emitting diode OLED1 and the second organic light-emitting diode OLED2. In a display frame in which the third organic light-emitting diode OLED3 is required to emit light, the first organic light-emitting diode OLED1, the second organic light-emitting diode OLED2 and the third organic light-emitting diode OLED3 emit light simultaneously, which is equivalent to increase the area of luminescent materials of the first organic light-emitting diode OLED1 and the second organic light-emitting diode OLED2 and reduce the luminous brightness of the first organic light-emitting diode OLED1 and the second organic light-emitting diode OLED2. Thus, the service life of the first organic light-emitting diode OLED1 and the second organic light-emitting diode OLED2 can be prolonged. In order to ensure the display effect, the light-emitting area of the fourth organic light-emitting diode OLED4 must be increased to be matched with the first organic light-emitting diode OLED1, the second organic light-emitting diode OLED2, and the third organic light-emitting diode OLED3, which is also equivalent to improve the service life of the fourth organic light-emitting diode OLED4.

Although detailed description has been given above to the present disclosure with reference to general description and preferred embodiment, it is apparent to those skilled in the art that some modifications or improvements may be made on the basis of the embodiments of the present disclosure. Therefore, the modifications or improvements made without departing from the spirit of the present disclosure shall all fall within the scope of protection of the present disclosure.

The application claims priority to the Chinese patent application No. 201610596931.1, filed Jul. 26, 2016, the entire disclosure of which is incorporated herein by reference as part of the present application.

What is claimed is:

1. A pixel circuit, comprising:

a first light-emitting circuit configured to emit light in a working process;

a first drive circuit configured to drive the first light-emitting circuit;

a first compensating circuit configured to compensate the first drive circuit;

a first data write circuit configured to write data into the first drive circuit;

a first reset circuit configured to reset the first drive circuit;

a first storage circuit configured to store a driving voltage of the first drive circuit;

a first initializing circuit configured to initialize the first light-emitting circuit;

a first light-emitting control circuit configured to control ON and OFF operations of the first light-emitting circuit;

a second light-emitting circuit configured to emit light in the working process;

a second drive circuit configured to drive the second light-emitting circuit;

a second compensating circuit configured to compensate the second drive circuit;

a second data write circuit configured to write data into the second drive circuit;

a second reset circuit configured to reset the second drive circuit;

a second storage circuit configured to store a driving voltage of the second drive circuit;

a second initializing circuit configured to initialize the second light-emitting circuit;

a second light-emitting control circuit configured to control ON and OFF operations of the second light-emitting circuit;

a third light-emitting circuit configured to emit light in the working process;

a third light-emitting control circuit configured to control ON and OFF operations of the third light-emitting circuit;

a third drive circuit, directly connected to a control end of the first drive circuit and a control end of the second drive circuit respectively, and configured to drive the third light-emitting circuit;

a third initializing circuit configured to initialize the third light-emitting circuit;

a first power end configured to provide a first luminous voltage for the first light-emitting circuit, the second light-emitting circuit and the third light-emitting circuit;

a second power end configured to provide a second luminous voltage for the first light-emitting circuit, the second light-emitting circuit and the third light-emitting circuit;

a third power end configured to provide a reset voltage for the first reset circuit and the second reset circuit;

a first data signal end configured to provide a first data signal or a standby signal for the first data write circuit;

a second data signal end configured to provide a second data signal or a standby signal for the second data write circuit;

a first control end configured to provide a first control signal for controlling ON and OFF operations of the first reset circuit and the second reset circuit;

a second control end configured to provide a second control signal for controlling ON and OFF operations of the first data write circuit, the first compensating circuit, the second data write circuit, and the second compensating circuit;

a third control end configured to provide a third control signal for controlling ON and OFF operations of the first initializing circuit, the second initializing circuit and the third initializing circuit; and a fourth control end configured to provide a fourth control signal for controlling ON and OFF operations of the first light-emitting control circuit, the second light-emitting control circuit and the third light-emitting control circuit.

2. The pixel circuit according to claim 1, wherein the first data write circuit includes a first transistor; the first light-emitting control circuit includes a second transistor and a fifth transistor; the first compensating circuit includes a third transistor; the first drive circuit includes a fourth transistor; the first reset circuit includes a sixth transistor; the first initializing circuit includes a seventh transistor; the first storage circuit includes a first storage capacitor; the first light-emitting circuit includes a first organic light-emitting diode; the third light-emitting control circuit includes an eighth transistor and a eleventh transistor; the third drive circuit includes a ninth transistor and a tenth transistor; the third initializing circuit includes a twelfth transistor; the second reset circuit includes a thirteenth transistor; the second light-emitting control circuit includes a fourteenth transistor and an eighteenth transistor; the second data write circuit includes a fifteenth transistor; the second compensating circuit includes a sixteenth transistor; the second drive circuit includes a seventeenth transistor; the second initializing circuit includes a nineteenth transistor; the second storage circuit includes a second storage capacitor; the second light-emitting circuit includes a second organic light-emitting diode; and the third light-emitting circuit includes a third organic light-emitting diode.

3. The pixel circuit according to claim 2, wherein a source electrode of the first transistor is electrically connected with the first data signal end; a gate electrode of the first transistor and a gate electrode of the third transistor are electrically connected with the second control end; a drain electrode of the first transistor, a drain electrode of the second transistor, a source electrode of the third transistor, and a source electrode of the fourth transistor are electrically connected with each other;

a gate electrode of the second transistor and a gate electrode of the fifth transistor are electrically connected with the fourth control end; a source electrode of the second transistor, and a first end of the first storage capacitor are electrically connected with the first power end;

a drain electrode of the third transistor is electrically connected with a first node;

a gate electrode of the fourth transistor is electrically connected with the first node, and a drain electrode of the fourth transistor is electrically connected with a source electrode of the fifth transistor;

a drain electrode of the fifth transistor and a drain electrode of the seventh transistor are electrically connected with a first end of the first organic light-emitting diode;

a source electrode of the sixth transistor and a source electrode of the seventh transistor are electrically connected with the third power end; a gate electrode of the sixth transistor is electrically connected with the first control end; a drain electrode of the sixth transistor is electrically connected with the first node;

a gate electrode of the seventh transistor is electrically connected with the third control end;

a second end of the first storage capacitor is electrically connected with the first node;

a second end of the first organic light-emitting diode is electrically connected with the second power end;

a source electrode of the eighth transistor is electrically connected with the first power end; a gate electrode of the eighth transistor is electrically connected with the fourth control end; a drain electrode of the eighth transistor is electrically connected with a source electrode of the ninth transistor;

a gate electrode of the ninth transistor is electrically connected with the first node, and a drain electrode of the ninth transistor is electrically connected with a source electrode of the tenth transistor;

a gate electrode of the tenth transistor is electrically connected with a second node, and a drain electrode of the tenth transistor is electrically connected with a source electrode of the eleventh transistor;

a gate electrode of the eleventh transistor is electrically connected with the fourth control end; a drain electrode of the eleventh transistor and a first end of the third organic light-emitting diode, and a drain electrode of the twelfth transistor are electrically connected with each other;

a gate electrode of the twelfth transistor is electrically connected with the third control end; a source electrode of the twelfth transistor, a drain electrode of the thirteenth transistor and a source electrode of the nineteenth transistor are electrically connected with the third power end;

a source electrode of the thirteenth transistor is electrically connected with the second node, and a gate electrode of the thirteenth transistor is electrically connected with the first control end;

a source electrode of the fourteenth transistor and a first end of the second storage capacitor are electrically connected with the first power end; a gate electrode of the fourteenth transistor and a gate electrode of the eighteenth transistor are electrically connected with the fourth control end; a drain electrode of the fourteenth transistor, a drain electrode of the fifteenth transistor, a source electrode of the sixteenth transistor, and a source electrode of the seventeenth transistor are electrically connected with each other;

a source electrode of the fifteenth transistor is electrically connected with the second data signal end; a gate electrode of the fifteenth transistor and a gate electrode of the sixteenth transistor are electrically connected with the second control end;

a drain electrode of the sixteenth transistor is electrically connected with the second node;

a gate electrode of the seventeenth transistor is electrically connected with the second node, and a drain electrode of the seventeenth transistor is electrically connected with a source electrode of the eighteenth transistor;

a drain electrode of the eighteenth transistor and a drain electrode of the nineteenth transistor are electrically connected with a first end of the second organic light-emitting diode;

a gate electrode of the nineteenth transistor is electrically connected with the third control end;

a second end of the second storage capacitor is electrically connected with the second node;

a second end of the second organic light-emitting diode is electrically connected with the second power end; and a second end of the third organic light-emitting diode is electrically connected with the second power end.

4. The pixel circuit according to claim 2, wherein a threshold voltage of the fourth transistor is equal to a threshold voltage of the ninth transistor; and a threshold voltage of the tenth transistor is equal to a threshold voltage of the seventeenth transistor.

5. The pixel circuit according to claim 2, wherein the first organic light-emitting diode emits light of first color in the working process; the second organic light-emitting diode emits light of second color in the working process; the third organic light-emitting diode emits light of third color in the working process; and a mixed color of the light of the first color and the light of the second color is the third color.

6. The pixel circuit according to claim 5, wherein the light of the first color is red light; the light of the second color is green light; and the light of the third color is yellow light.

7. A display panel, comprising the pixel circuit according to claim 1.

8. The display panel according to claim 7, further comprising:

a fourth light-emitting circuit configured to emit light in a working process;

a fourth drive circuit configured to drive the fourth light-emitting circuit;

a third compensating circuit configured to compensate the fourth drive circuit;

a third data write circuit configured to write data into the fourth drive circuit;

a third reset circuit configured to reset the fourth drive circuit;

a third storage circuit configured to store a driving voltage of the fourth drive circuit;

a fourth initializing circuit configured to initialize the fourth light-emitting circuit;

a fourth light-emitting control circuit configured to control ON and OFF operations of the fourth light-emitting circuit;

the first power end configured to provide the first luminous voltage for the fourth light-emitting circuit;

the second power end configured to provide the second luminous voltage for the fourth light-emitting circuit;

the third power end configured to provide the reset voltage for the third reset circuit;

a third data signal end configured to provide a third data signal or a standby signal for the third data write circuit;

the first control end configured to provide the first control signal for controlling ON and OFF operations of the third reset circuit;

the second control end configured to provide the second control signal for controlling ON and OFF operations of the third data write circuit and the third compensating circuit;

the third control end configured to provide the third control signal for controlling ON and OFF operations of the fourth initializing circuit; and the fourth control end configured to provide the fourth control signal for controlling ON and OFF operations of the fourth light-emitting control circuit.

9. The display panel according to claim 8, wherein the first light-emitting circuit includes a first organic light-emitting diode, the second light-emitting circuit includes a second organic light-emitting diode; the third light-emitting circuit includes a third organic light-emitting diode; and the fourth light-emitting circuit includes a fourth organic light-emitting diode.

10. The display panel according to claim 9, wherein the first organic light-emitting diode emits red light in the working process; the second organic light-emitting diode emits green light in the working process; the third organic light-emitting diode emits yellow light in the working process; and the fourth organic light-emitting diode emits blue light in the working process.

11. A driving method of the display panel of claim 8, comprising: a reset period, a compensation period, an initialization period, and an emission period, wherein in the reset period, the first control end outputs a valid signal; the second control end outputs an invalid signal; the third control end outputs an invalid signal; the fourth control end outputs an invalid signal; the first data signal end outputs a standby signal; the second data signal end outputs a standby signal; the third data signal end outputs a standby signal;

in the compensation period, the first control end outputs an invalid signal; the second control end outputs a valid signal; the third control end outputs an invalid signal; the fourth control end outputs an invalid signal; the first data signal end outputs a first data signal or a standby signal, and the second data signal end outputs a second data signal or a standby signal; the third data signal end outputs a third data signal or a standby signal;

in the initialization period, the first control end outputs an invalid signal; the second control end outputs an invalid signal; the third control end outputs a valid signal; the fourth control end outputs an invalid signal; the first data signal end outputs a standby signal; the second data signal end outputs a standby signal; the third data signal end outputs a standby signal; and in the emission period, the first control end outputs an invalid signal; the second control end outputs an invalid signal; the third control end outputs an invalid signal; the fourth control end outputs a valid signal; the first data signal end outputs a standby signal; and the second data signal end outputs a standby signal; the third data signal end outputs a standby signal.

12. A pixel circuit, comprising:

a first light-emitting circuit configured to emit light in a working process;

a first drive circuit configured to drive the first light-emitting circuit;

a first compensating circuit configured to compensate the first drive circuit;

a first data write circuit configured to write data into the first drive circuit;

a first reset circuit configured to reset the first drive circuit;

a first storage circuit configured to store a driving voltage of the first drive circuit;

a first initializing circuit configured to initialize the first light-emitting circuit;

a first light-emitting control circuit configured to control ON and OFF operations of the first light-emitting circuit;

a second light-emitting circuit configured to emit light in the working process;

a second drive circuit configured to drive the second light-emitting circuit;

a second compensating circuit configured to compensate the second drive circuit;

a second data write circuit configured to write data into the second drive circuit;

a second reset circuit configured to reset the second drive circuit;

a second storage circuit configured to store a driving voltage of the second drive circuit;

a second initializing circuit configured to initialize the second light-emitting circuit;

a second light-emitting control circuit configured to control ON and OFF operations of the second light-emitting circuit;

a third light-emitting circuit configured to emit light in the working process;

a third light-emitting control circuit configured to control ON and OFF operations of the third light-emitting circuit;

a third drive circuit, directly connected to a control end of the first drive circuit and a control end of the second drive circuit respectively, and configured to drive the third light-emitting circuit;

a third initializing circuit configured to initialize the third light-emitting circuit;

a fourth light-emitting circuit configured to emit light in a working process;

a fourth drive circuit configured to drive the fourth light-emitting circuit;

a third compensating circuit configured to compensate the fourth drive circuit;

a third data write circuit configured to write data into the fourth drive circuit;

a third reset circuit configured to reset the fourth drive circuit;

a third storage circuit configured to store a driving voltage of the fourth drive circuit;

a fourth initializing circuit configured to initialize the fourth light-emitting circuit;

a fourth light-emitting control circuit configured to control ON and OFF operations of the fourth light-emitting circuit;

a first power end configured to provide a first luminous voltage for the first light-emitting circuit, the second light-emitting circuit, the third light-emitting circuit and the fourth light-emitting circuit;

a second power end configured to provide a second luminous voltage for the first light-emitting circuit, the second light-emitting circuit, the third light-emitting circuit and the fourth light-emitting circuit;

a third power end configured to provide a reset voltage for the first reset circuit, the second reset circuit and the third reset circuit;

a first data signal end configured to provide a first data signal or a standby signal for the first data write circuit;

a second data signal end configured to provide a second data signal or a standby signal for the second data write circuit;

a third data signal end configured to provide a third data signal or a standby signal for the third data write circuit;

a first control end configured to provide a first control signal for controlling ON and OFF operations of the first reset circuit, the second reset circuit and the third reset circuit;

a second control end configured to provide a second control signal for controlling ON and OFF operations of the first data write circuit, the first compensating circuit, the second data write circuit, the second compensating circuit, the third data write circuit and the third compensating circuit;

a third control end configured to provide a third control signal for controlling ON and OFF operations of the first initializing circuit, the second initializing circuit, the third initializing circuit, and the fourth initializing circuit; and a fourth control end configured to provide a fourth control signal for controlling ON and OFF operations of the first light-emitting control circuit, the second light-emitting control circuit, the third light-emitting control circuit and the fourth light-emitting control circuit;

wherein the third data write circuit includes a twentieth transistor; the fourth light-emitting control circuit includes a twenty-first transistor and a twenty-fourth transistor; the third compensating circuit includes a twenty-second transistor; the fourth drive circuit includes a twenty-third transistor; the third reset circuit includes a twenty-fifth transistor; the fourth initializing circuit includes a twenty-sixth transistor; the third storage circuit includes a third storage capacitor; and the fourth light-emitting circuit includes a fourth organic light-emitting diode;

a source electrode of the twentieth transistor is electrically connected with the third data signal end; a gate electrode of the twentieth transistor and a gate electrode of the twenty-second transistor are electrically connected with the second control end; a drain electrode of the twentieth transistor, a drain electrode of the twenty-first transistor, a source electrode of the twenty-second transistor, and a source electrode of the twenty-third transistor are electrically connected with each other;

a gate electrode of the twenty-first transistor and a gate electrode of the twenty-fourth transistor are electrically connected with the fourth control end; a source electrode of the twenty-first transistor and a first end of the third storage capacitor are electrically connected with the first power end;

a drain electrode of the twenty-second transistor is electrically connected with a third node;

a gate electrode of the twenty-third transistor is electrically connected with the third node, and a drain electrode of the twenty-third transistor is electrically connected with a source electrode of the twenty-fourth transistor;

a drain electrode of the twenty-fourth transistor and a drain electrode of the twenty-sixth transistor are electrically connected with a first end of the fourth organic light-emitting diode;

a source electrode of the twenty-fifth transistor and a source electrode of the twenty-sixth transistor are electrically connected with the third power end; a gate electrode of the twenty-fifth transistor is electrically connected with the first control end;

a drain electrode of the twenty-fifth transistor is electrically connected with the third node;

a gate electrode of the twenty-sixth transistor is electrically connected with the third control end;

a second end of the third storage capacitor is electrically connected with the third node; and a second end of the fourth organic light-emitting diode is electrically connected with the second power end.

13. A driving method of the pixel circuit according to claim 12, comprising: a reset period, a compensation period, an initialization period and an emission period, wherein in the reset period, the first control end outputs a valid signal; the second control end outputs an invalid signal; the third control end outputs an invalid signal; the fourth control end outputs an invalid signal; the first data signal end outputs a standby signal; the second data signal end outputs a standby signal; the third data signal end outputs a standby signal;

in the compensation period, the first control end outputs an invalid signal; the second control end outputs a valid signal; the third control end outputs an invalid signal; the fourth control end outputs an invalid signal; the first data signal end outputs a first data signal, and the second data signal end outputs a standby signal; or the first data signal end outputs a standby signal, and the second data signal end outputs a second data signal; or the first data signal end outputs the first data signal, and the second data signal end outputs the second data signal; the third data signal end outputs a third data signal or a standby signal;

in the initialization period, the first control end outputs an invalid signal; the second control end outputs an invalid signal; the third control end outputs a valid signal; the fourth control end outputs an invalid signal; the first data signal end outputs a standby signal; the second data signal end outputs a standby signal; the third data signal end outputs a standby signal; and in the emission period, the first control end outputs an invalid signal; the second control end outputs an invalid signal; the third control end outputs an invalid signal; the fourth control end outputs a valid signal; the first data signal end outputs a standby signal; and the second data signal end outputs a standby signal; and the third data signal end outputs a standby signal.

14. The driving method according to claim 13, further comprising: a pre-reset period and a pre-emission period, wherein the pre-reset period is after the emission period and before the reset period; the pre-emission period is after the initialization period and before the emission period;

in the pre-reset period, the first control end outputs an invalid signal; the second control end outputs an invalid signal; the third control end outputs an invalid signal; the fourth control end outputs an invalid signal; the third data signal end outputs a standby signal; and in the pre-emission period, the first control end outputs an invalid signal; the second control end outputs an invalid signal; the third control end outputs an invalid signal; the fourth control end outputs an invalid signal; and the third data signal end outputs a standby signal.

15. A display panel, comprising the pixel circuit according to claim 12.

16. A driving method of a pixel circuit, wherein the pixel circuit, comprises:

a first light-emitting circuit configured to emit light in a working process;

a first drive circuit configured to drive the first light-emitting circuit;

a first compensating circuit configured to compensate the first drive circuit;

a first data write circuit configured to write data into the first drive circuit;

a first reset circuit configured to reset the first drive circuit;

a first storage circuit configured to store a driving voltage of the first drive circuit;

a first initializing circuit configured to initialize the first light-emitting circuit;

a first light-emitting control circuit configured to control ON and OFF operations of the first light-emitting circuit;

a second light-emitting circuit configured to emit light in the working process;

a second drive circuit configured to drive the second light-emitting circuit;

a second compensating circuit configured to compensate the second drive circuit;

a second data write circuit configured to write data into the second drive circuit;

a second reset circuit configured to reset the second drive circuit;

a second storage circuit configured to store a driving voltage of the second drive circuit;

a second initializing circuit configured to initialize the second light-emitting circuit;

a second light-emitting control circuit configured to control ON and OFF operations of the second light-emitting circuit;

a third light-emitting circuit configured to emit light in the working process;

a third light-emitting control circuit configured to control ON and OFF operations of the third light-emitting circuit;

a third drive circuit, directly connected to a control end of the first drive circuit and a control end of the second drive circuit respectively, and configured to drive the third light-emitting circuit;

a third initializing circuit configured to initialize the third light-emitting circuit;

a first power end configured to provide a first luminous voltage for the first light-emitting circuit, the second light-emitting circuit and the third light-emitting circuit;

a second power end configured to provide a second luminous voltage for the first light-emitting circuit, the second light-emitting circuit and the third light-emitting circuit;

a third power end configured to provide a reset voltage for the first reset circuit and the second reset circuit;

a first data signal end configured to provide a first data signal or a standby signal for the first data write circuit;

a second data signal end configured to provide a second data signal or a standby signal for the second data write circuit;

a first control end configured to provide a first control signal for controlling ON and OFF operations of the first reset circuit and the second reset circuit;

a second control end configured to provide a second control signal for controlling ON and OFF operations of the first data write circuit, the first compensating circuit, the second data write circuit, and the second compensating circuit;

a third control end configured to provide a third control signal for controlling ON and OFF operations of the first initializing circuit, the second initializing circuit and the third initializing circuit; and a fourth control end configured to provide a fourth control signal for controlling ON and OFF operations of the first light-emitting control circuit, the second light-emitting control circuit and the third light-emitting control circuit;

the driving method comprises: a reset period, a compensation period, an initialization period, and an emission period, wherein in the reset period, the first control end outputs a valid signal; the second control end outputs an invalid signal; the third control end outputs an invalid signal; the fourth control end outputs an invalid signal; the first data signal end outputs a standby signal; the second data signal end outputs a standby signal;

in the compensation period, the first control end outputs an invalid signal; the second control end outputs a valid signal; the third control end outputs an invalid signal; the fourth control end outputs an invalid signal; the first data signal end outputs a first data signal, and the second data signal end outputs a standby signal; or the first data signal end outputs a standby signal, and the second data signal end outputs a second data signal; or the first data signal end outputs the first data signal, and the second data signal end outputs the second data signal;

in the initialization period, the first control end outputs an invalid signal; the second control end outputs an invalid signal; the third control end outputs a valid signal; the fourth control end outputs an invalid signal; the first data signal end outputs a standby signal; the second data signal end outputs a standby signal; and in the emission period, the first control end outputs an invalid signal; the second control end outputs an invalid signal; the third control end outputs an invalid signal; the fourth control end outputs a valid signal; the first data signal end outputs a standby signal; and the second data signal end outputs a standby signal.

17. The driving method according to claim 16, further comprising: a pre-reset period and a pre-emission period, wherein the pre-reset period is after the emission period and before the reset period; the pre-emission period is after the initialization period and before the emission period;

in the pre-reset period, the first control end outputs an invalid signal; the second control end outputs an invalid signal; the third control end outputs an invalid signal; the fourth control end outputs an invalid signal; the first data signal end outputs a standby signal; the second data signal end outputs a standby signal; and in the pre-emission period, the first control end outputs an invalid signal; the second control end outputs an invalid signal; the third control end outputs an invalid signal; the fourth control end outputs an invalid signal; the first data signal end outputs a standby signal; and the second data signal end outputs a standby signal.

18. The driving method according to claim 16, wherein in the compensation period, when the first data signal end outputs the first data signal and the second data signal end outputs the standby signal, the first light-emitting circuit emits light independently, and the first data signal is configured to control a luminous brightness of the first light-emitting circuit;

when the first data signal end outputs the standby signal and the second data signal end outputs the second data signal, the second light-emitting circuit emits light independently, and the second data signal is configured to control a luminous brightness of the second light-emitting circuit; and when the first data signal end outputs the first data signal and the second data signal end outputs the second data signal, the first light-emitting circuit, the second light-emitting circuit and the third light-emitting circuit emit light simultaneously; the first data signal is configured to control the luminous brightness of the first light-emitting circuit; the second data signal is configured to control the luminous brightness of the second light-emitting circuit; and a smaller data signal in the first data signal and the second data signal is configured to control a luminous brightness of the third light-emitting circuit.

* * * * *